(12) United States Patent
Kwon et al.

(10) Patent No.: US 12,394,691 B2
(45) Date of Patent: Aug. 19, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Donghoon Kwon, Hwaseong-si (KR); Chanwook Seo, Hwaseong-si (KR); Chungki Min, Hwaseong-si (KR); Boun Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 896 days.

(21) Appl. No.: 17/559,094

(22) Filed: Dec. 22, 2021

(65) Prior Publication Data

US 2022/0328379 A1 Oct. 13, 2022

(30) Foreign Application Priority Data

Apr. 8, 2021 (KR) .................. 10-2021-0046013

(51) Int. Cl.
*H01L 23/48* (2006.01)
*H01L 23/528* (2006.01)
(Continued)

(52) U.S. Cl.
CPC ........ *H01L 23/481* (2013.01); *H01L 23/5283* (2013.01); *H01L 25/0657* (2013.01);
(Continued)

(58) Field of Classification Search
CPC ........ H10B 43/40; H10B 41/40; H10B 43/27; H10B 41/27; H10B 43/10; H10B 41/10;
(Continued)

(56) References Cited

U.S. PATENT DOCUMENTS 8,338,882 B2 12/2012 Tanaka et al.
10,396,090 B2 8/2019 Lee
(Continued)

FOREIGN PATENT DOCUMENTS

CN 109755254 A 5/2019
KR 10-2005-0002503 A 1/2005
(Continued)

OTHER PUBLICATIONS

Korean Office Action dated Mar. 4, 2025, in connection with Korean Application No. 10-2021-0046013, with English translation thereof.

*Primary Examiner* — Fernando L Toledo
*Assistant Examiner* — Warwick R Steer
(74) *Attorney, Agent, or Firm* — Wolf, Greenfield & Sacks, P.C.

(57) ABSTRACT

A semiconductor device includes a first substrate; circuit elements on the first substrate; lower interconnection lines electrically connected to the circuit elements; a second substrate on the lower interconnection lines; gate electrodes spaced apart from each other and stacked on the second substrate in a first direction that is perpendicular to an upper surface of the second substrate; channel structures penetrating through the gate electrodes, extending in the first direction, and respectively including a channel layer; through-vias extending in the first direction and electrically connecting at least one of the gate electrodes or the channel structures to the circuit elements; an insulating region surrounding side surfaces of through-vias; and a via pad between the through-vias and at least one of the lower interconnection lines in the first direction and spaced apart from the second substrate in a second direction, parallel to an upper surface of the second substrate.

20 Claims, 27 Drawing Sheets

(51) Int. Cl.
*H01L 25/065* (2023.01)
*H01L 25/10* (2006.01)
*H10B 41/10* (2023.01)
*H10B 41/27* (2023.01)
*H10B 41/35* (2023.01)
*H10B 41/40* (2023.01)
*H10B 43/10* (2023.01)
*H10B 43/27* (2023.01)
*H10B 43/35* (2023.01)
*H10B 43/40* (2023.01)

(52) U.S. Cl.
CPC ........... *H01L 25/105* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H01L 2225/06506* (2013.01); *H01L 2225/0651* (2013.01); *H01L 2225/06524* (2013.01); *H01L 2225/06544* (2013.01); *H01L 2225/06548* (2013.01); *H01L 2225/06562* (2013.01)

(58) Field of Classification Search
CPC ..... H10B 43/35; H10B 41/35; H01L 23/5283; H01L 23/5384; H01L 2224/01; H01L 2225/06548
See application file for complete search history.

(56) References Cited

U.S. PATENT DOCUMENTS

| | | |
|---|---|---|
| 2017/0358593 A1* | 12/2017 | Yu ............................ H10B 43/27 |
| 2020/0098782 A1 | 3/2020 | Nojima et al. |
| 2020/0144242 A1* | 5/2020 | Park ......................... H01L 24/83 |
| 2020/0194454 A1 | 6/2020 | Zhang |
| 2020/0295026 A1 | 9/2020 | Oike |
| 2020/0295033 A1 | 9/2020 | Sakamoto et al. |
| 2021/0296324 A1* | 9/2021 | Lim .................... H01L 21/31116 |

FOREIGN PATENT DOCUMENTS

| | | |
|---|---|---|
| KR | 10-2020-0016150 A | 2/2020 |
| KR | 10-2020-0034880 A | 4/2020 |

\* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority under 35 U.S.C. § 119 to Korean Patent Application No. 10-2021-0046013 filed on Apr. 8, 2021 in the Korean Intellectual Property Office, the disclosure of which is incorporated herein by reference in its entirety.

BACKGROUND

The present inventive concepts relate to semiconductor devices and data storage systems including the same.

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Example embodiments provide a semiconductor device having improved reliability.

Example embodiments provide a data storage system including a semiconductor device having improved reliability.

According to example embodiments, a semiconductor device may include a first semiconductor structure including a first substrate, circuit elements on the first substrate, and lower interconnection lines. The semiconductor device may include a second semiconductor structure including a second substrate that is located on the first semiconductor structure and has a first region and a second region, gate electrodes spaced apart from each other and stacked on the second substrate in a first direction, interlayer insulating layers stacked alternately with the gate electrodes, a first horizontal conductive layer that is located below the gate electrodes on the first region, a horizontal insulating layer that is located below the gate electrodes on the second region, a second horizontal conductive layer on the first horizontal conductive layer and the horizontal insulating layer, channel structures penetrating through the gate electrodes in the first region and respectively including a channel layer, and separation regions penetrating through the gate electrodes and extending in a second direction. The semiconductor device may include a through-interconnection region including sacrificial insulating layers that are located side by side with the gate electrodes in the second region and stacked alternately with the interlayer insulating layers, through-vias penetrating through the sacrificial insulating layers and the interlayer insulating layers, extending in the first direction, and electrically connecting the gate electrodes and the circuit elements to each other, and a via pad that is spaced apart from the second substrate and connects the through-vias and the lower interconnection lines to each other. The via pad may include first pad lines that are extending in the second direction, and second pad lines intersecting the first pad lines and extending in a third direction.

According to example embodiments, a semiconductor device may include a first substrate; circuit elements that are located on the first substrate; lower interconnection lines electrically connected to the circuit elements; a second substrate that is located on the lower interconnection lines; gate electrodes spaced apart from each other and stacked in a first direction on the second substrate, wherein the first direction is perpendicular to an upper surface of the second substrate; channel structures penetrating through the gate electrodes, extending in the first direction, and respectively including a channel layer; through-vias extending in the first direction and electrically connecting at least one of the gate electrodes or the channel structures to the circuit elements; an insulating region surrounding side surfaces of the through-vias; and a via pad that is located between the through-vias and at least one of the lower interconnection lines in the first direction and is spaced apart from the second substrate in a second direction that is parallel to the upper surface of the second substrate.

According to example embodiments, a data storage system may include a semiconductor storage device and processing circuitry. The semiconductor storage device may include a first substrate, circuit elements that are located on the first substrate, lower interconnection lines electrically connected to the circuit elements, a second substrate that is located on the lower interconnection lines, gate electrodes spaced apart from each other and stacked in a first direction on the second substrate, wherein the first direction is perpendicular to an upper surface of the second substrate, channel structures penetrating through the gate electrodes, extending in the first direction, and respectively including a channel layer, through-vias extending in the first direction and electrically connecting at least one of the gate electrodes or the channel structures to the circuit elements, an insulating region surrounding side surfaces of through-vias, a via pad that is located between the through-vias and at least one of the lower interconnection lines in the first direction and is spaced apart from the second substrate in a second direction that is parallel to the upper surface of the second substrate, and an input/output pad electrically connected to the circuit elements. The processing circuitry may be connected to the semiconductor storage device through the input/output pad and may be configured to control the semiconductor storage device.

BRIEF DESCRIPTION OF THE DRAWINGS

The above and other aspects, features, and advantages of the present inventive concepts will be more clearly understood from the following detailed description, taken in conjunction with the accompanying drawings.

DETAILED DESCRIPTION

Figure 1:
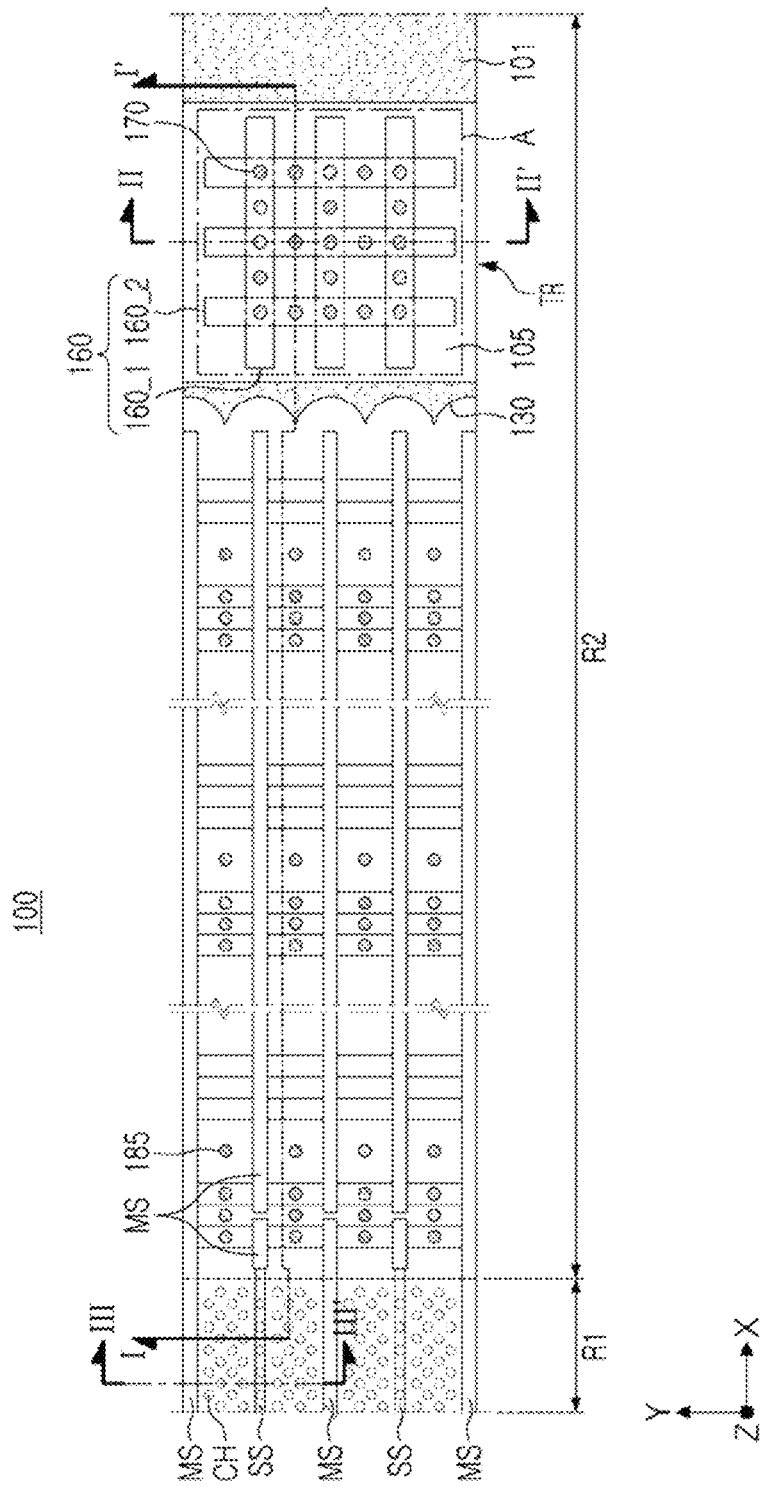
FIG. 1 is a schematic plan view of a semiconductor device according to example embodiments.

Hereinafter, example embodiments will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic plan view of a semiconductor device according to example embodiments.

Figure 2A:
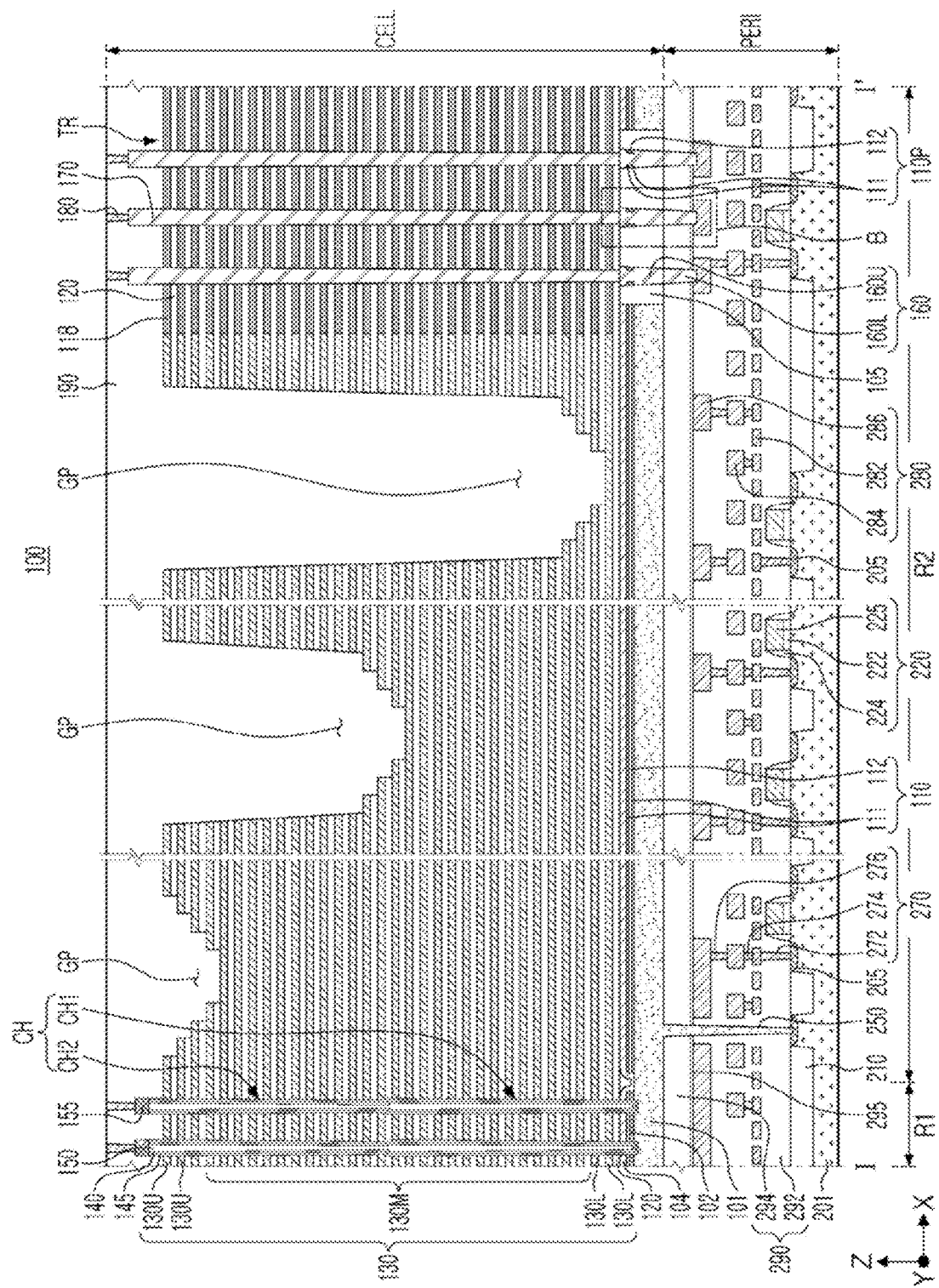
FIGS. 2A, 2B, and 2C are schematic cross-sectional views of a semiconductor device according to example embodiments.
Figure 2B:
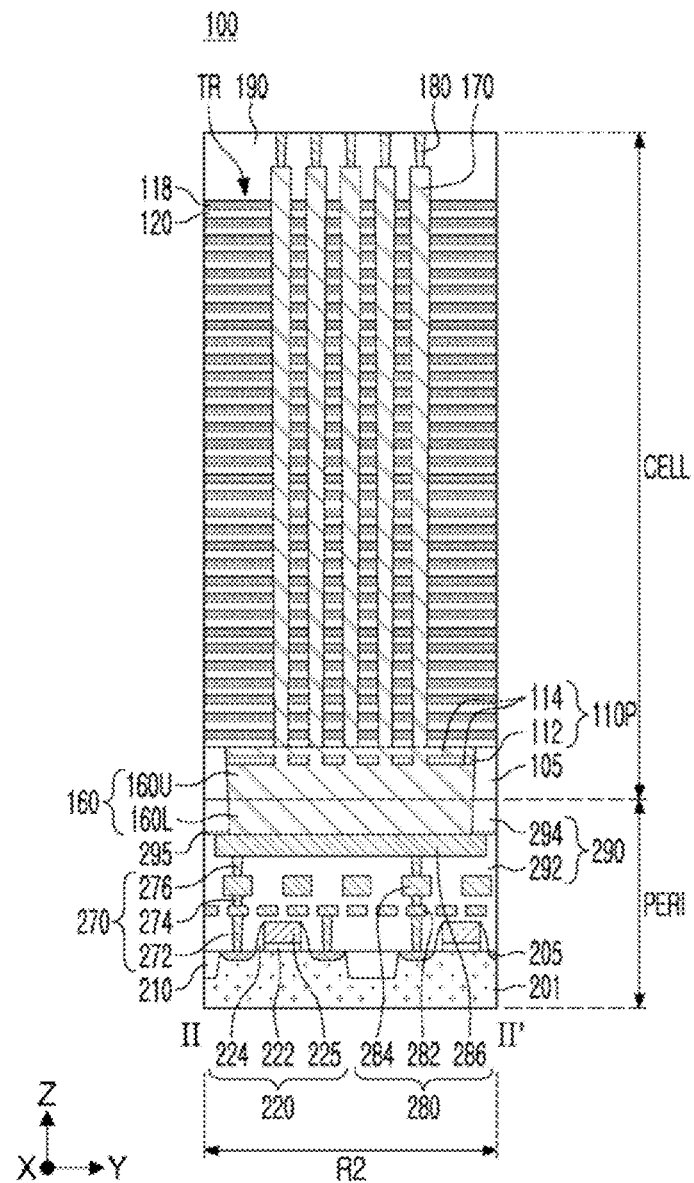
Figure 2C:
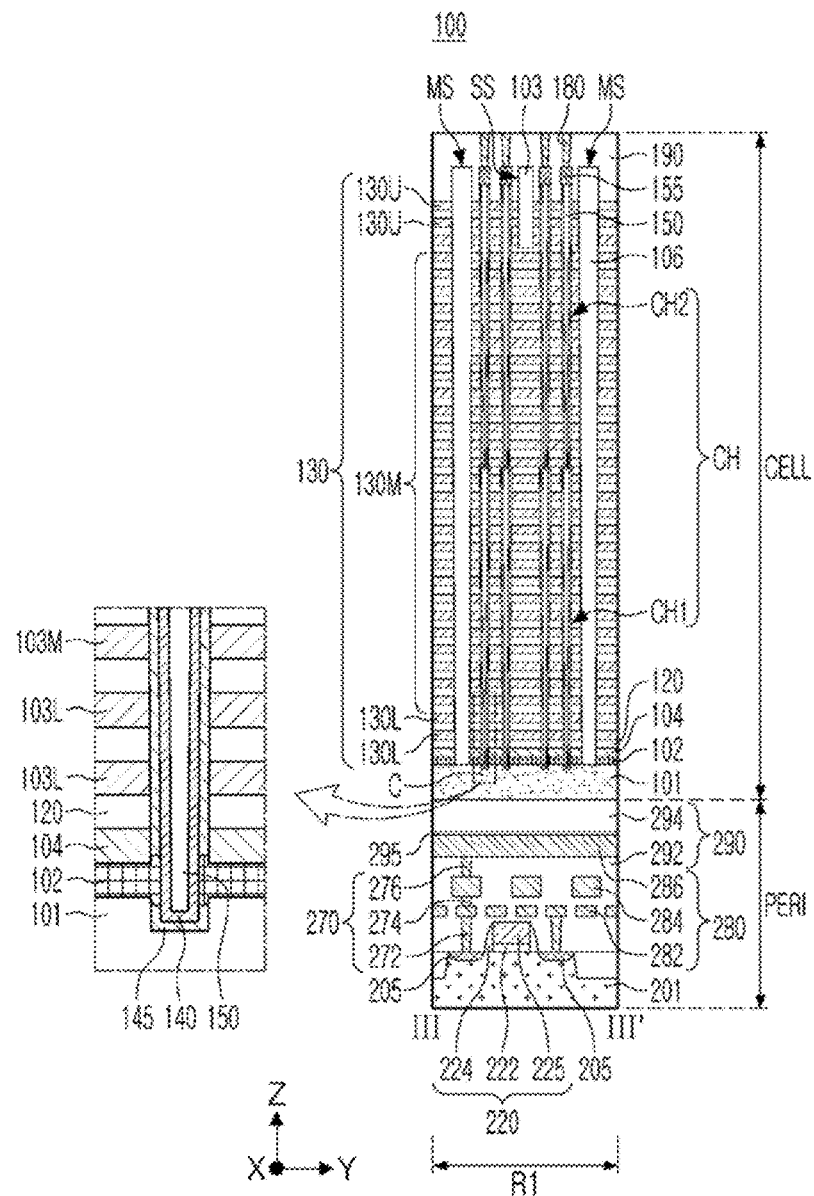

FIGS. 2A, 2B, and 2C are schematic cross-sectional views of a semiconductor device according to example embodiments. FIGS. 2A to 2C are cross-sectional views taken along lines I-I', and of FIG. 1, respectively.

Figure 3:
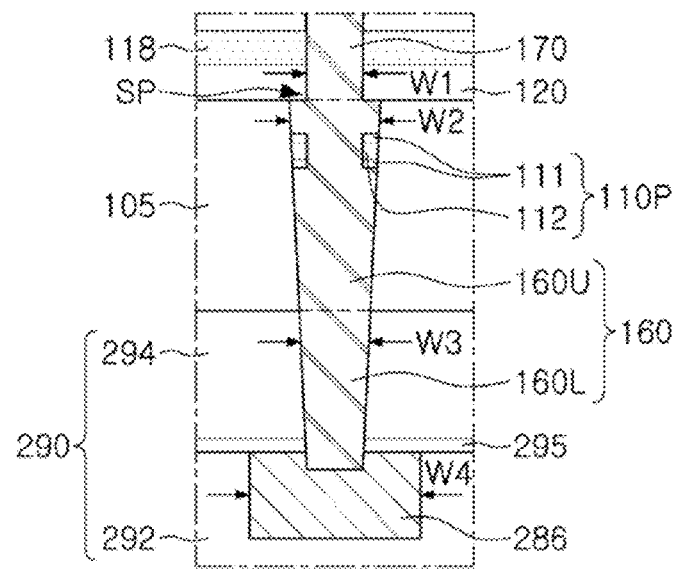
FIG. 3 is a partially enlarged view of a semiconductor device according to example embodiments.

FIG. 3 is a partially enlarged view of a semiconductor device according to example embodiments. FIG. 3 is an enlarged view of region "B" of FIG. 2A.

Referring to FIGS. 1 to 3, a semiconductor device 100 (where a semiconductor device as described to herein may be a semiconductor storage device in some example embodiments) may include a peripheral circuit region PERI and a memory cell region CELL. The peripheral circuit region PERI is a first semiconductor structure including a first substrate 201, and the memory cell region CELL is a second semiconductor structure including a second substrate 101. The memory cell region CELL may be disposed on the peripheral circuit region PERI. In contrast, in example embodiments, the cell region CELL may be disposed below the peripheral circuit region PERI. The semiconductor device 100 may further include a through-interconnection region TR including a through-via 170 electrically connecting the peripheral circuit region PERI and the memory cell region CELL to each other. The through-interconnection region TR may be disposed to extend from the memory cell region CELL to an upper region of the peripheral circuit region PERI.

The peripheral circuit region PERI may include a first substrate 201, impurity regions 205 and device isolation layers 210 in the first substrate 201, circuit elements 220 disposed on the first substrate 201, a peripheral region insulating layer 290, a lower passivation layer 295, lower contact plugs 270, lower interconnection lines 280, and a ground via 250.

The first substrate 201 may have an upper surface extending in an X direction and a Y direction. An active region may be defined in the first substrate 201 by the device isolation layers 210. Impurity regions 205 including impurities may be disposed in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit elements 220 may include planar transistors. Each of the circuit elements 220 may include a circuit gate dielectric layer 222, a spacer layer 224, and a circuit gate electrode 225. The impurity regions 205 may be disposed, as source/drain regions, in the first substrate 201 on opposite sides adjacent to the circuit gate electrode 225.

The peripheral region insulating layer 290 may be disposed on the circuit element 220 on the first substrate 201. The peripheral region insulating layer 290 may include first and second peripheral region insulating layers 292 and 294, and each of the first and second peripheral region insulating layers 292 and 294 may include a plurality of insulating layers. The peripheral region insulating layer 290 may be formed of an insulating material.

The lower passivation layer 295 may be disposed on upper surfaces of uppermost, third lower interconnection lines 286 between the first and second peripheral region insulating layers 292 and 294. In example embodiments, the lower passivation layer 295 may be further disposed on upper surfaces of the first and second lower interconnection lines 282 and 284. The lower passivation layer 295 may reduce or prevent the lower interconnection lines 280 from being contaminated by a metal material disposed therebelow. The lower passivation layer 295 may be formed of an insulating material different from that of the peripheral region insulating layer 290, and may include, for example, silicon nitride.

The lower contact plugs 270 and the lower interconnection lines 280 may constitute a lower interconnection structure electrically connected to the circuit elements 220 and the impurity regions 205. The lower contact plugs 270 may have a cylindrical shape, and the lower interconnection lines 280 may have a line shape. The lower contact plugs 270 may include first to third lower contact plugs 272, 274, and 276. The first lower contact plugs 272 may be disposed on the circuit elements 220 and the impurity regions 205, the second lower contact plugs 274 may be disposed on the first lower interconnection lines 282 and the third lower contact plugs 276 may be disposed on the second lower interconnection lines 284. The lower interconnection lines 280 may include first to third lower interconnection lines 282, 284, and 286. The first lower interconnection lines 282 may be disposed on the first lower contact plugs 272, the second lower interconnection lines 284 may be disposed on the second lower contact plugs 274, and the third lower interconnection lines 286 may be disposed on the third lower contact plugs 276. Each of the lower contact plugs 270 and the lower interconnection lines 280 may include a conductive material, for example, tungsten (W), copper (Cu), aluminum (Al), or the like, and may further include a diffusion barrier. However, the total number of layers and arrangement of the lower contact plugs 270 and the lower interconnection lines 280 may vary according to example embodiments.

The ground via 250 may be disposed in the peripheral circuit region PERI to connect the first substrate 201 and the second substrate 101 to each other. The ground via 250 may serve to ground the second substrate 101 and the second horizontal conductive layer 104 to reduce or prevent arcing from occurring during a process of fabricating the semiconductor device 100. Although only a portion is illustrated in FIG. 2A, in the semiconductor device 100, for example, a plurality of ground vias 250 may be disposed at regular intervals in the Y direction. The ground via 250 may be disposed on a lower end of the second region R2 of the second substrate 101, but example embodiments are not limited thereto. The ground via 250 may be disposed to be spaced apart from an adjacent active region, among active regions in which the circuit elements 220 of the peripheral circuit region PERI are disposed. The ground via 250 may directly connect the first substrate 201 and the second substrate 101 to each other, as illustrated in FIG. 2A. However, according to example embodiments, the ground via 250 may not directly connect the first substrate 201 and the second substrate 101 to each other, and may include a portion of the lower interconnection structure to be configured to include a conductive plug and a conductive line. The ground via 250 may include a semiconductor material, for example, at least one of silicon (Si) or germanium (Ge), and may further include impurities. However, in example embodiments, the ground via 250 may not be formed to be integrated with the second substrate 101, but may be formed of a material different from that of the second substrate 101.

The memory cell region CELL includes a second substrate 101 that is on the first semiconductor structure of the peripheral circuit region PERI. The second substrate may have a first region R1 and a second region R2, gate electrodes 130 stacked on the second substrate 101, the first and second horizontal conductive layers 102 and 104 disposed below the gate electrodes 130 on the first region R1, a horizontal insulating layer 110 disposed below the gate electrodes 130 on the second region R2, separation regions MS extending while penetrating through a stack structure of the gate electrodes 130, upper separation regions SS penetrating through a portion of the stack structure, and channel structures CH disposed to penetrate through the stack structure. As shown, the second substrate 101 may be on the lower interconnection lines 280. As shown, either or both of the first and second horizontal conductive layers 102 and 104 may be understood to be a horizontal conductive layer that is located at least partially between the second substrate 101 and the gate electrodes 130. The memory cell region CELL may further include interlayer insulating layers 120 stacked alternately with the gate electrodes 130 on the second substrate 101, upper contact plugs 180 connected to the channel structure CH, gate contact plugs 185 connected to the gate electrodes 130 (e.g., respectively connected to the gate electrodes 130 in the second region R2), and a cell region insulating layer 190 covering the gate electrodes 130. For better understanding of description, in FIG. 1, some components such as sacrificial insulating layers 118 are omitted in a right region of the gate electrodes 130.

The first region R1 of the second substrate 101 is a region in which the gate electrodes 130 are vertically stacked and the channel structures CH are disposed, and may be a region in which memory cells are disposed. The second region R2 may be a region in which the gate electrodes 130 extend by different lengths, and may correspond to a region for electrically connecting the memory cells to the peripheral circuit region PERI. The second region R2 may be disposed on at least one end of the first region R1 in at least one direction, for example, the X direction. The second substrate 101 may have a plate shape and may function as at least a portion of a common source line of the semiconductor device 100.

The second substrate 101 may have an upper surface extending in the X direction and the Y direction. The second substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer, such as a polycrystalline silicon layer, or an epitaxial layer.

The first and second horizontal conductive layers 102 and 104 may be disposed to be sequentially stacked on an upper surface of the first region R1 of the second substrate 101. The second horizontal conductive layer 104 may be on the first horizontal conductive layer 102 and the horizontal insulating layer 110. The first horizontal conductive layer 102 may not extend to the second region R2 of the second substrate 101, and the second horizontal conductive layer 104 may extend to the second region R2. The first horizontal conductive layer 102 may function as a portion of a common source line of the semiconductor device 100, for example, as a common source line together with the second substrate 101. As illustrated in the enlarged view of FIG. 2C, the first horizontal conductive layer 102 may be directly connected to the channel layer 140 on a periphery of the channel layer 140. The second horizontal conductive layer 104 may be in contact with the second substrate 101 in certain regions in which the first horizontal conductive layer 102 and the horizontal insulating layer 110 are not disposed. The second horizontal conductive layer 104 may cover an end portion of the first horizontal conductive layer 102 or the horizontal insulating layer 110 in the certain regions, and may be bent to extend upwardly of the second substrate 101.

The first and second horizontal conductive layers 102 and 104 may include a semiconductor material such as polycrystalline silicon. In some example embodiments, at least the first horizontal conductive layer 102 may be a layer doped with impurities having the same conductivity type as the second substrate 101, and the second horizontal conductive layer 104 may be a doped layer or a layer including impurities diffused the first horizontal conductive layer 102. However, the material of the second horizontal conductive layer 104 is not limited to the semiconductor material, and the second horizontal conductive layer 104 may be replaced with an insulating layer.

The horizontal insulating layer 110 may be disposed on the second substrate 101 to be parallel to the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion of the horizontal insulating layer 110 is replaced with the first horizontal conductive layer 102 in the process of fabricating the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as the interlayer insulating layers 120, and the second horizontal insulating layer 112 may be formed of a material different from that of the interlayer insulating layers 120.

The substrate insulating layer 105 may be disposed on the second peripheral region insulating layer 294 in a region in which a portion of the second substrate 101, the horizontal insulating layer 110, and the second horizontal conductive layer 104 is removed. A lower surface of the substrate insulating layer 105 may be coplanar with a lower surface of the second substrate 101 or may be disposed on a lower level than the lower surface of the second substrate 101. An upper surface of the substrate insulating layer 105 may be coplanar with an upper surface of the second horizontal conductive layer 104 or may be disposed on a lower level than an upper surface of the second horizontal conductive layer 104. In example embodiments, the substrate insulating layer 105 may include a plurality of layers stacked on the second peripheral region insulating layer 294. The substrate insulating layer 105 may be formed of an insulating material and may include, for example, silicon oxide, silicon oxynitride, or silicon nitride.

As described herein, a "level" or "height level" of a surface, end, structure, or the like may refer to a distance from a common (e.g., same) reference location in the Z direction (e.g., a lower surface of the first substrate 201). Therefore, when a first element is described herein to be at a higher level than a second element, the first element may be further from the common reference location (e.g., a lower surface of the first substrate 201) than the second element in the Z direction. Furthermore, when a first element is described herein to be at a lower level than a second element, the first element may be closer to the common reference location (e.g., a lower surface of the first substrate 201) than the second element in the Z direction. Furthermore, when a first element is described herein to be at a same level as a second element, the first element may be equally distant from/close to the common reference location (e.g., a lower surface of the first substrate 201) as the second element in the Z direction.

The gate electrodes 130 may be vertically spaced apart from each other and stacked on the second substrate 101 in the Z direction (e.g., a first direction) to constitute a stack structure. The gate electrodes 130 may include lower gate electrodes 130L constituting a gate of a ground select transistor, memory gate electrodes 130M constituting a plurality of memory cells, and upper gate electrodes 130U constituting gates of string select transistors. The number of memory gate electrodes 130M constituting memory cells may be determined depending on the capacity of the semiconductor device 100. According to example embodiments, the number of the upper gate electrodes 130U and the number of the lower gate electrodes 130L may each be one to four or more, and the upper and lower gate electrodes 130U and 130L may have the same structure as the memory gate electrodes 130M, or may have a structure different from a structure of the memory gate electrodes 130M. In example embodiments, the gate electrodes 130 may further include a gate electrode disposed above the upper gate electrode 130U and/or below the lower gate electrode 130 and constituting an erase transistor used in an erase operation using gate-induced drain leakage (GIDL) current. In addition, some gate electrodes 130, for example, memory gate electrodes 130M adjacent to the upper or lower gate electrodes 130U or 130L may be dummy gate electrodes.

The gate electrodes 130 may be vertically spaced apart from each other and stacked on the first region R1, and extend from the first region R1 to the second region R2 by different lengths to form a staircase-shaped step structure in the gate pad regions GP. As illustrated in FIG. 2A, the gate electrodes 130 may be removed from upper portions thereof to a predetermined or alternatively, desired depth in the gate pad regions GP, and the gate pad regions GP may have different depths. The gate electrodes 130 may form a step structure to be symmetrical in the X direction in each of the gate pad regions GP, but a specific shape of the step structure is not limited thereto. The gate electrodes 130 may be disposed to have a step structure even in the Y direction. Due to the step structure, the lower gate electrode 130 may extend further than the upper gate electrode 130 to have regions exposed upwardly from the interlayer insulating layers 120, respectively.

The gate electrodes 130 may include a metal material, for example, tungsten (W). According to example embodiments, the gate electrodes 130 may include polycrystalline silicon or a metal silicide material. In example embodiments, the gate electrodes 130 may further include a diffusion barrier layer. For example, the diffusion barrier layer may include tungsten nitride (WN), tantalum nitride (TaN), titanium nitride (TiN), or combinations thereof.

The interlayer insulating layers 120 may be disposed between the gate electrodes 130. Similarly to the gate electrodes 130, the interlayer insulating layers 120 may be spaced apart from each other in a direction perpendicular to an upper surface of the second substrate 101 and may be disposed to extend in the X direction. The interlayer insulating layers 120 may include an insulating material such as silicon oxide or silicon nitride.

The separation regions MS may be disposed to extend in the X direction (e.g., a second direction) and penetrate through the gate electrodes 130 in the first region R1 and the second region R2. As illustrated in FIG. 1, the separation regions MS may be disposed to be parallel to each other. Some of the separation regions MS may extend as a single region along the first and second regions R1 and R2, or may be intermittently disposed in the second region R2. However, in example embodiments, an arrangement order, an arrangement interval, and the like, of the separation regions MS may vary according to example embodiments. As illustrated in FIG. 2C, the separation regions MS may penetrate through the entire gate electrodes 130, stacked on the second substrate 101, to be connected to the second substrate 101. A separation insulating layer 106 may be disposed in the separation regions MS.

The upper separation regions SS may extend in the X direction between the separation regions MS. The upper separation regions SS may be disposed in a portion of the second region R2 and the first region R1 to penetrate through some gate electrodes 130 including an uppermost gate electrode 130, among the gate electrodes 130. As illustrated in FIG. 2C, the upper separation regions SS may separate, for example, a total of three gate electrodes 130 from each other in the Y direction. However, the number of gate electrodes 130 separated by the upper separation regions SS may vary according to example embodiments. The upper separation regions SS may include an upper insulating layer 103.

The channel structures CH may each constitute a single memory cell string, and may be disposed to be spaced apart from each other while constituting rows and columns on the first region R1. The channel structures CH may be disposed to form a grid shape in an X-Y plane, or may be disposed in zigzag form in one direction. The channel structures CH may have a columnar shape, and may have inclined side surface narrowed in a direction toward the second substrate 101 depending on an aspect ratio. In example embodiments, the channel structures CH disposed adjacent to an end portion of the first region R1 may be dummy channels which do not substantially constitute a memory cell string.

The channel structures CH may include vertically stacked first and second channel structures CH1 and CH2. The channel structures CH may have a shape in which first channel structures CH1, penetrating through a lower stack structure of the gate electrodes 130, and second channel structures CH2, penetrating through an upper stack structure of the gate electrodes 130, are connected to each other. The channel structures CH may have a bent portion formed due to a difference in widths in the connection region. However, the number of channel structures stacked in a Z direction may vary according to example embodiments.

As shown in FIGS. 2A and 2C, the channel structures CH may penetrate through the gate electrodes 130 in the first region R1 and may respectively include a channel layer 140. As illustrated in the enlarged view of FIG. 2C, the channel layer 140 may be disposed in the channel structures CH. In the channel structures CH, the channel layer 140 may be formed to have an annular shape surrounding a channel buried insulating layer 150 therein. However, according to example embodiments, the channel layer 140 may have a columnar shape such as a cylindrical shape or a prismatic shape without the channel buried insulating layer 150. The channel layer 140 may be connected to the first horizontal conductive layer 102 below the channel layer 140. The channel layer 140 may include a semiconductor material such as polycrystalline silicon or single-crystalline silicon.

The gate dielectric layer 145 may be disposed between the gate electrodes 130 and the channel layer 140. Although not illustrated in detail, the gate dielectric layer 145 may include a tunneling layer, a charge storage layer, and a blocking layer sequentially stacked from the channel layer 140. The tunneling layer may tunnel charges to the charge storage layer and may include, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 145 may extend along the gate electrodes 130 in a horizontal direction. The channel pad 155 may only be disposed on an upper end of the upper second channel structure CH2. The channel pads 155 may include, for example, doped polycrystalline silicon.

The channel layer 140, the gate dielectric layer 145, and the channel buried insulating layer 150 may be in a state of being connected to each other between the first channel structure CH1 and the second channel structure CH2. An interlayer insulating layer 120 having a relatively high thickness may be disposed between the first channel structure CH1 and the second channel structure CH2, for example, between the lower stack structure and the upper stack structure. However, the thickness and shape of the interlayer insulating layers 120 may vary according to example embodiments.

The cell region insulating layer 190 may be disposed to cover the second substrate 101, the gate electrodes 130 on the second substrate 101, and the peripheral region insulating layer 290. The cell region insulating layer 190 may be formed of an insulating material, or may include a plurality of insulating layers.

The upper contact plugs 180 and the gate contact plugs 185 may be interconnection structures electrically connected to the gate electrodes 130, the channel structures CH, and the like.

The upper contact plugs 180 may be connected to the channel structures CH or the through-vias 170. The upper contact plugs 180 may penetrate through at least a portion of the cell region insulating layer 190 and may be connected to the channel structures CH and upper surfaces of the through-vias 170. The gate contact plugs 185 may be connected to the gate electrodes 130 in the gate pad regions GP, as illustrated in FIG. 1. The gate contact plugs 185 may penetrate through at least a portion of the cell region insulating layer 190 and may be disposed to be connected to each of the upwardly exposed gate electrodes 130. In a region, not illustrated, the second substrate 101 may also be connected to a contact plug.

The upper contact plugs 180 and the gate contact plugs 185 may include a conductive material, for example, tungsten (W), copper (Cu), aluminum (Al), or the like, and may each further include a diffusion barrier layer. However, the number of layers and the arrangement of the upper contact plugs 180 and the gate contact plugs 185, constituting the upper interconnection structure, may vary according to example embodiments. The semiconductor device 100 may further include interconnection lines connected to the upper contact plugs 180 and the gate contact plugs 185.

The through-interconnection region TR may include a through-interconnection structure for electrically connecting the memory cell region CELL and the peripheral circuit region PERI to each other. The through interconnection region TR may include through-vias 170 extending in the Z direction (e.g., first direction), a via pad 160 below the through-vias 170, and a through-insulating region surrounding the through-vias 170 (e.g., surrounding side surfaces of the through-vias 170). The through-insulating region, also referred to herein as an insulating region, may include sacrificial insulating layers 118, interlayer insulating layers 120 disposed alternately with the sacrificial insulating layers 118, and a substrate insulating layer 105, and may surround side surfaces of the through-vias 170.

The through-interconnection region TR may be disposed outside the gate electrodes 130 to which the gate electrodes 130 do not extend, and may be disposed outside the gate contact plugs 185. The size, arrangement, and shape of the through-interconnection region TR may vary according to example embodiments. The through-interconnection region TR is illustrated as being disposed in the second region R2, but example embodiments are not limited thereto, and may be further disposed to have the same structure or different structures in another region of the second region R2 and the first region R1.

The through-vias 170 may penetrate through the cell region insulating layer 190 and the through-insulating region from above, and may extend in a direction perpendicular to an upper surface of the second substrate 101. As shown in at least FIG. 1, the through-vias 170 may be disposed outside the gate contact plugs 185 in the X direction. For example, the through-vias 170 may be disposed on one side of the gate contact plugs 185 in a direction opposing a direction in which the gate contact plugs 185 face the first region R1. Upper ends of the through-vias 170 may be connected to the upper contact plugs 180, and lower ends of the through-vias 170 may be connected to the via pad 160. The through-vias 170 may penetrate through the sacrificial insulating layers 118 and the interlayer insulating layers 120, extending in the Z direction (e.g., first direction), and may electrically connect the gate electrodes 130 and the circuit elements 220 to each other. In some example embodiments, the through-vias 170 may connect (e.g., electrically connect) at least one of the gate electrodes 130 or the channel structures CH to the circuit elements 220. The number, arrangement, and shape of the through-vias 170 in a single through-interconnection region TR may vary according to example embodiments. The through-vias 170 may include a conductive material, for example, a metal material such as tungsten (W), copper (Cu), or aluminum (Al).

The via pad 160 may be disposed between the through-vias 170 and at least one of the lower interconnection lines 280 (e.g., the third lower interconnection lines 286) in the Z direction (e.g., first direction) to electrically and physically connect the through-vias 170 and the at least one of the lower interconnection lines 280 (e.g., third lower interconnection lines 286) to each other. The via pad 160 may be understood to connect the through-vias 170 and at least one of the lower interconnection lines 280 (e.g., the third lower interconnection lines 286) to each other. The via pad 160 may be disposed in a region in which a portion of the second substrate 101 is removed such that second substrate regions, a portion of the second substrate 101, are spaced apart from each other. Restated, and as shown in at least FIG. 2A, the second substrate 101 may include second substrate regions (which may be defined by the removed portions in which the via pad 160 is located) that are spaced apart from each other in the X and/or Y directions (e.g., second direction), such that the via pad 160 is located between the second substrate regions. The via pad 160 may be horizontally spaced apart from the second substrate 101 (e.g., spaced apart from the second substrate 101 in the X and/or Y directions which may be referred to as a second direction that is parallel to the upper surface of the second substrate 101) and the second horizontal conductive layer 104. As shown, the through-vias 170 and the via pad 160 may be understood to be spaced apart (e.g., in the X and/or Y directions) from at least the second horizontal conductive layer 104. However, according to example embodiments, the second substrate 101 may not be disposed on a right side of the through-interconnection region TR in FIGS. 1 and 2A. As described herein, an element that is "spaced apart" from another element may be understood to be isolated from direct contact with the other element.

Figure 4:
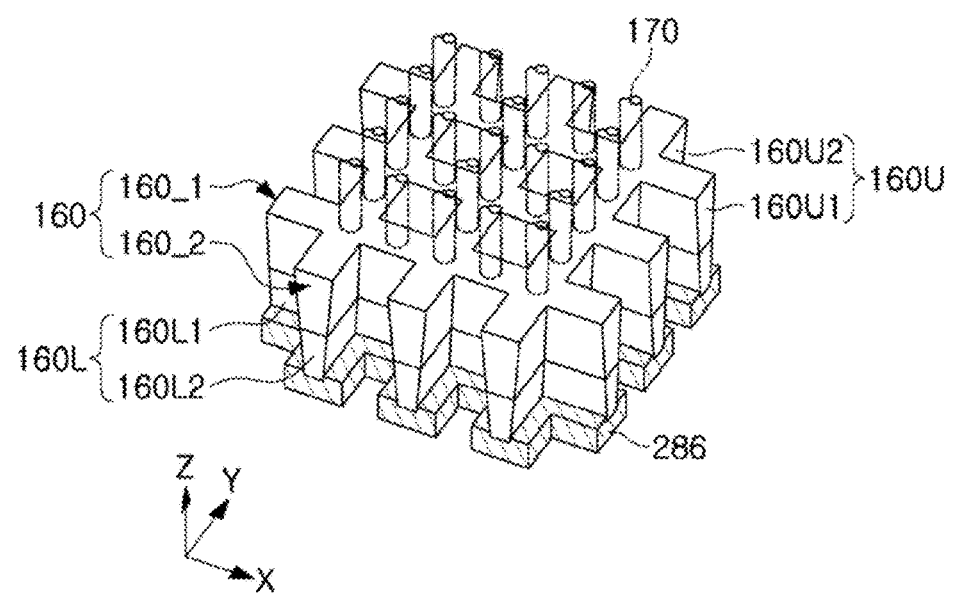
FIG. 4 is a fragmentary perspective view schematically illustrating a semiconductor device according to example embodiments.

The via pad 160 may include a pad line extending in a direction that is parallel to the upper surface of the second substrate 101 and which is connected to at least a portion of the through-vias 170. The via pad 160 may include first pad lines 160_1, extending in the X direction (e.g., second direction) and second pad lines 160_2 intersecting the first pad lines 160_1 and extending in the Y direction (e.g., third direction). As illustrated in FIG. 1, the via pad 160 has a shape in which first pad lines 160_1 extending in the X direction and second pad lines 160_2 extending in the Y direction intersect each other in a grid shape in a plan view, such that the via pad 160 has a grid shape in a plan view. The via pad 160 may thus include a plurality of pad lines that are located (e.g., configured) to have or define a grid shape in a plan view. The via pad 160 may include a lower via pad 160L and an upper via pad 160U stacked vertically, as illustrated in FIGS. 2A and 2B. The lower via pad 160L may be on the lower interconnection lines 280 (e.g., the third lower interconnection lines 286) and the upper via pad 160U may be on the lower via pad 160L. Each of the lower via pad 160L and the upper via pad 160U may include a single layer having a grid shape and the lower via pad 160L and the upper via pad 160U may be integrally formed. The grid shape of the via pad 160 may be a shape corresponding to the third lower interconnection lines 286. Accordingly, at least the third lower interconnection lines 286 below the via pad 160 may have a grid shape that corresponds to the via pad 160 (e.g., corresponds to the grid shape of the via pad). As used herein, "corresponding shape" may mean having the same shape or pattern and having the same size or a size increased or decreased by a predetermined or alternatively, desired ratio. The shape of the via pad 160 will be described in more detail below with reference to FIG. 4 illustrating region "A." The via pad 160 may have an inclined side surface or a side surface vertical in the Z direction.

The lower via pad 160L may be connected to the third lower interconnection line 286 through the second peripheral region insulating layer 294 and the lower passivation layer 295. The lower via pad 160L may be disposed on the same height as at least a portion of the ground via 250. An upper surface of the lower via pad 160L may be positioned on the same or substantially the same height as an upper surface of the ground via 250 and/or the lower surface of the second substrate 101. An entire side surface of the lower via pad 160L may be surrounded by the second peripheral region insulating layer 294 and the lower passivation layer 295.

The upper via pad 160U may penetrate through the substrate insulating layer 105 and may be disposed at the same or substantially the same height as the substrate insulating layer 105. The upper via pad 160U may be disposed at a height corresponding to the second substrate 101, the horizontal insulating layer 110, and the second horizontal conductive layer 104. As used herein, "corresponding height" may refer to the same height or a height including a difference in process. An entire side surface of the upper via pad 160U may be surrounded by the substrate insulating layer 105. As an entire side surface of the lower via pad 160L may be surrounded by the second peripheral region insulating layer 294 and the lower passivation layer 295 it will be understood that at least one insulating layer (e.g., substrate insulating layer 105, second peripheral region insulating layer 294, etc.) may surround an entire side surface of a via pad 160. In the upper via pad 160U, the horizontal insulating layer 110P may remain in a region other than below the through-vias 170. As shown in at least FIG. 2C, the horizontal insulating layer 110 (e.g., the remaining horizontal insulating layer 110P) may be interposed in at least one region in the via pad 160. The remaining horizontal insulating layer 110P is represented separately from the horizontal insulating layers 110P in other regions. The horizontal insulating layer 110P may remain in a region excluding a region vertically extending from the through-vias 170, for example, at least in a region shifted from the through-vias 170. The horizontal insulating layer 110P may remain without being removed in a process of removing a preliminary upper via pad 160UP and a preliminary lower via pad 160LP to be described later with reference to FIG. 12J. The upper via pad 160U may cover upper and lower surfaces and internal side surfaces of the horizontal insulating layer 110P, and may have a shape bent along the horizontal insulating layer 110P. Accordingly, the via pad 160 may cover an upper surface and a lower surface of the horizontal insulating layer 110 (e.g., the remaining horizontal insulating layer 110P) in the via pad 160.

In some example embodiments, the via pad 160 may be disposed in a region in which the second substrate 101 is removed. Therefore, the substrate insulating layer 105 may be formed to have a planar upper surface to reduce or prevent defects from occurring during a process. In addition, the through-vias 170 and an interconnection structure of the peripheral circuit region PERI may be stably connected to each other.

As illustrated in FIG. 3, the via pad 160 may be formed to be integrated with the through-vias 170. For example, the via pad 160 may be formed of the same metal material as the through-vias 170. For example, the via pad 160 may include a conductive material, for example, a metal material such as tungsten (W), copper (Cu), or aluminum (Al). The through-vias 170 and the via pad 160 may include a same conductive material (e.g., a first conductive material), including, for example, a metal material such as tungsten (W), copper (Cu), or aluminum (Al). The via pad 160 may include a material different from that of the second substrate 101 and the second horizontal conductive layer 104. Restated, the second substrate 101 and the second horizontal conductive layer 104 may each include a second conductive material different from the first conductive material that is included in the via pad 160 and the through-vias 170. The second conductive material of the second substrate 101 and the second horizontal conductive layer 104 may be absent in one or both of the via pad 160 and the through-vias 170. An interface between the lower via pad 160L and the upper via pad 160U and an interface between the upper via pad 160U and the through-vias 170 may not be distinguished from each other. A bent portion SP based on a change in width may be formed between the through-via 170 and the via pad 160. Restated, the via pad 160 and the through-via 170 may at least partially define a bent portion between the via pad 160 and the through-via 170 based on the change in width between the via pad 160 (e.g., W2) and the through-via 170 (e.g., W1).

The through-via 170 may have a first width W1 corresponding to a diameter, and the upper via pad 160U may have a second width W2 greater than the first width W1. As shown in at least FIG. 3, each of the through-vias 170 may have a first width W1, and each of the first pad lines 160_1 and the second pad lines 160_2 may have a second width W2, greater than the first width W1, in a direction perpendicular to an extending direction (e.g., perpendicular to the Z direction and/or first direction). The second width W2 may be in the range of about 1.2 times to about 1.8 times the first width W1. As the second width W2 has the above range, the via pad 160 may be stably connected to both the through-via 170 and the third lower interconnection line 286. The lower via pad 160L may have a third width W3 substantially equal to the second width W2 or smaller than the second width W2, and a bent portion may not formed between the lower via pad 160U and the upper via pad 160U. The third lower interconnection line 286, connected to the lower via pad 160L, may have a fourth width W4 greater than the first, second, and third widths W1, W2, and W3. The widths W1, W2, W3, and W4 may refer to one of an average width, an upper end width, or a lower end width. The second, third, and fourth widths W2, W3, and W4 may be widths in a direction, perpendicular to an extending direction in a line-shaped region of the via pad 160 and the third lower interconnection line 286.

In the through-insulating region, the sacrificial insulating layers 118 may be disposed on the same height level as the gate electrodes 130 to have the same thickness, and may be disposed such that side surfaces of the sacrificial insulating layers 118 are in contact with the gate electrodes 130 at a boundary of the through-interconnection region TR. The sacrificial insulating layers 118 may be located side by side with the gate electrodes 130 in the second region R2. The sacrificial insulating layers 118 may be stacked alternately with the interlayer insulating layers 120 to constitute the through-insulating region. The sacrificial insulating layers 118 may be disposed to have the same width as the substrate insulating layer 105 disposed therebelow or to have different widths as those of substrate insulating layer 105 disposed therebelow. The sacrificial insulating layers 118 may be formed of an insulating material different from that of the interlayer insulating layers 120, and may include, for example, silicon oxide, silicon nitride, or silicon oxynitride.

FIG. 4 is a partially perspective view schematically illustrating a semiconductor device according to example embodiments. FIG. 4 is an enlarged view of some components of region "A" of FIG. 1.

Referring to FIG. 4, a third lower interconnection line 286, a via pad 160, and through-vias 170 are illustrated.

The third lower interconnection line 286 may be disposed in a grid shape below a region in which second substrate regions of the second substrate 101 are spaced apart from each other (see FIG. 1).

The via pad 160 may be disposed on the third lower interconnection line 286 in a grid shape in a plan view having a smaller width than the third lower interconnection line 286. In the via pad 160, the width may not vary between the lower via pad 160L and the upper via pad 160U. However, the entire via pad 160 may have an inclined side surface depending on an aspect ratio. The lower via pad 160L may include first lower pad lines 160L1 and second lower pad lines 160L2 intersecting each other. The upper via pad 160U may include first upper pad lines 160U1 and second upper pad lines 160U2 intersecting each other. Each of the lower via pad 160L and the upper via pad 160U may be disposed as a single layer. The lower via pad 160L and the upper via pad 160U may be integrally formed. As shown in FIG. 4, the via pad 160 may include pad lines that are located in and/or define a grid shape in a plan view.

The through-vias 170 may include a plurality of cylindrical through-vias disposed on the via pad 160. The through-vias 170 may be connected to regions in which the first pad lines 160_1 and the second pad lines 160_2 of the via pad 160 intersect each other, and may be further connected to the other regions.

Figure 5A:
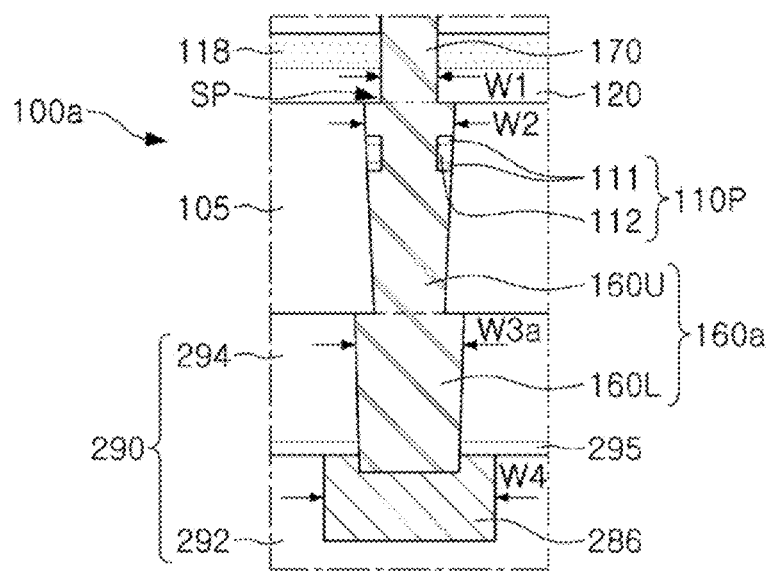
FIGS. 5A and 5B are partially enlarged views schematically illustrating semiconductor devices according to example embodiments, respectively.
Figure 5B:
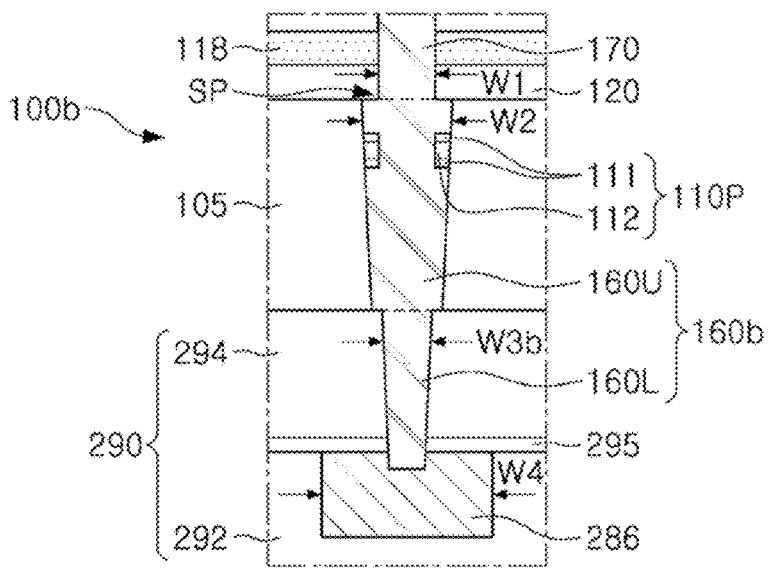

FIGS. 5A and 5B are partially enlarged views schematically illustrating a semiconductor device according to example embodiments. FIGS. 5A and 5B are enlarged views of a region corresponding to region "B" of FIG. 2A.

Referring to FIG. 5A, in a via pad 160a of a semiconductor device 100a, a lower via pad 160L and an upper via pad 160U may have different widths (e.g., different widths in one or more directions perpendicular to the Z direction or first direction). The upper via pad 160U may have a second width W2, and the lower via pad 160L may have a third width W3a greater than the second width W2. The third width W3a may be smaller than a fourth width W4 of a third lower interconnection line 286. A bent portion may be formed at a boundary between the lower via pad 160L and the upper via pad 160U as a width varies.

Referring to FIG. 5B, in a via pad 160b of a semiconductor device 100b, a lower via pad 160L and an upper via pad 160U may have different widths. The upper via pad 160U may have a second width W2, and the lower via pad 160L may have a third width W3b smaller than the second width W2. The third width W3b may be smaller than a fourth width W4 of a third lower interconnection line 286. A bent portion may be formed at a boundary between the lower via pad 160L and the upper via pad 160U as a width varies.

Figure 6A:
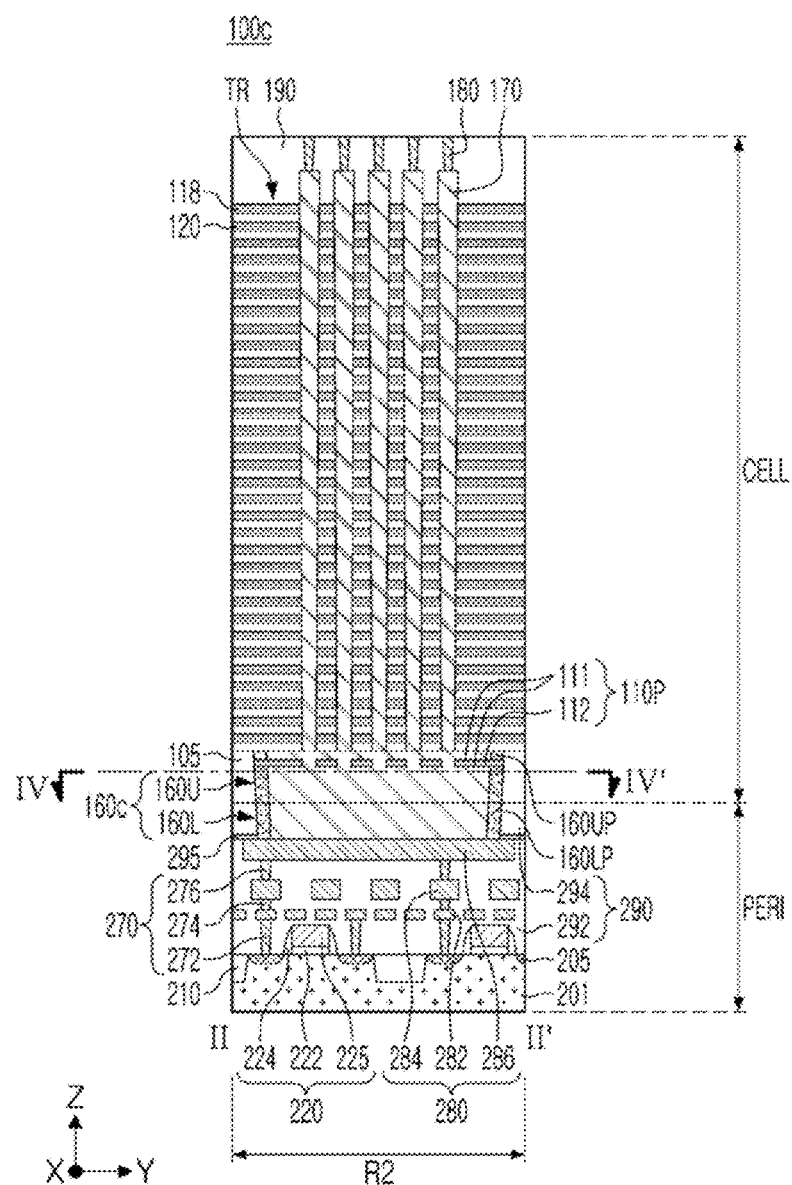
FIGS. 6A and 6B are a cross-sectional view and a plan view schematically illustrating a semiconductor device according to example embodiments, respectively.
Figure 6B:
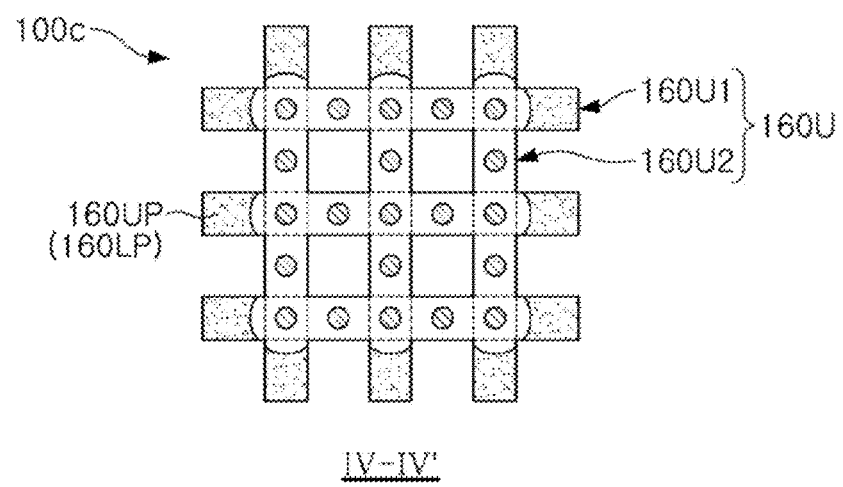

FIGS. 6A and 6B are a cross-sectional view and a plan view schematically illustrating a semiconductor device according to example embodiments, respectively. FIG. 6A illustrates a cross-section corresponding to FIG. 2B, and FIG. 6B illustrates a plane taken along line IV-IV' of FIG. 6A.

Referring to FIGS. 6A and 6B, in a via pad 160c of a semiconductor device 100c, an upper via pad 160U may include a preliminary upper via pad 160UP and a preliminary lower via pad 160LP remaining in at least a portion including an end portion. The preliminary upper via pad 160UP and the preliminary lower via pad 160LP of the via pad 160c may be layers remaining without being removed in a process of removing a preliminary upper via pad 160UP and a preliminary lower via pad 160LP to be described later with reference to FIG. 12J. The preliminary upper via pad 160UP and the preliminary lower via pad 160LP may include a material different from a material of the other regions of the via pad 160c. For example, the preliminary upper via pad 160UP and the preliminary lower via pad 160LP may be semiconductor layers and may include the same material as the second substrate 101. The via pad 160 may thus be understood to include, in addition to a first conductive material that is the same as a conductive material included in the through-vias 170, a second conductive material that is located in a region including an end portion of the via pad 160 and which is different from the first conductive material.

As illustrated in FIG. 6B, the preliminary upper via pad 160UP and the preliminary lower via pad 160LP may remain in a region outside the through-vias 170 disposed on an outermost side in a plan view. In example embodiments, when a distance between certain through-vias 170 is relatively long, the preliminary upper via pad 160UP and the preliminary lower via pad 160LP may further remain between the certain through-vias 170.

Figure 7A:
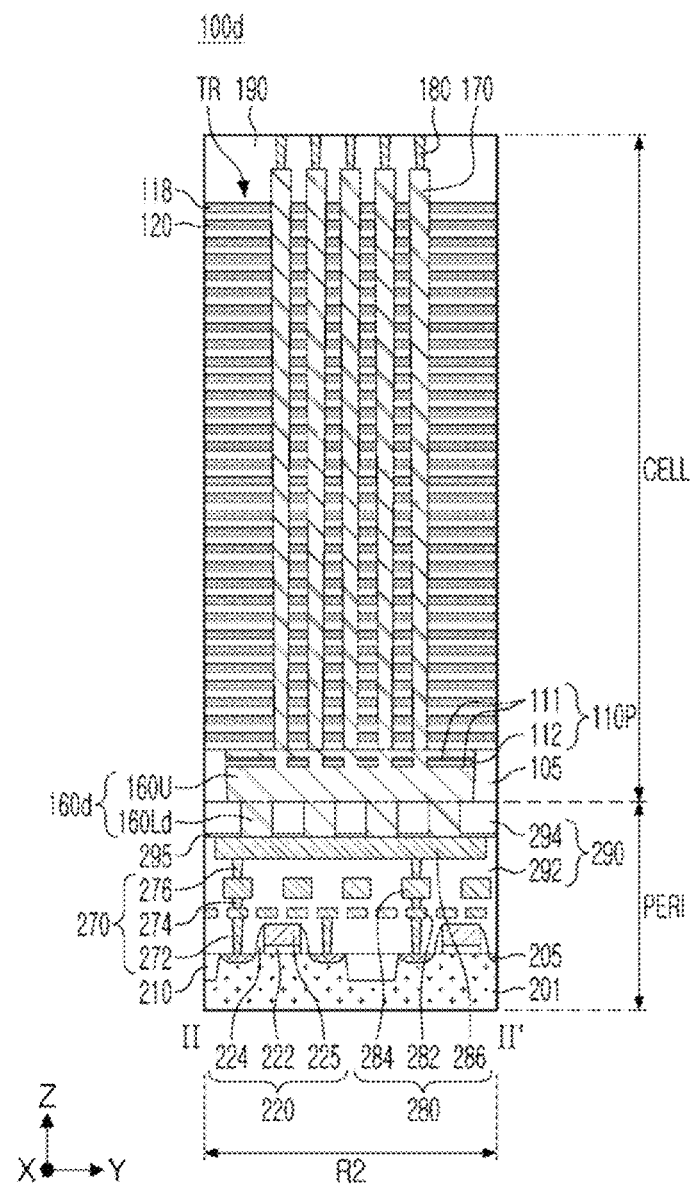
FIGS. 7A and 7B are a cross-sectional view and a perspective view schematically illustrating a semiconductor device according to example embodiments, respectively.
Figure 7B:
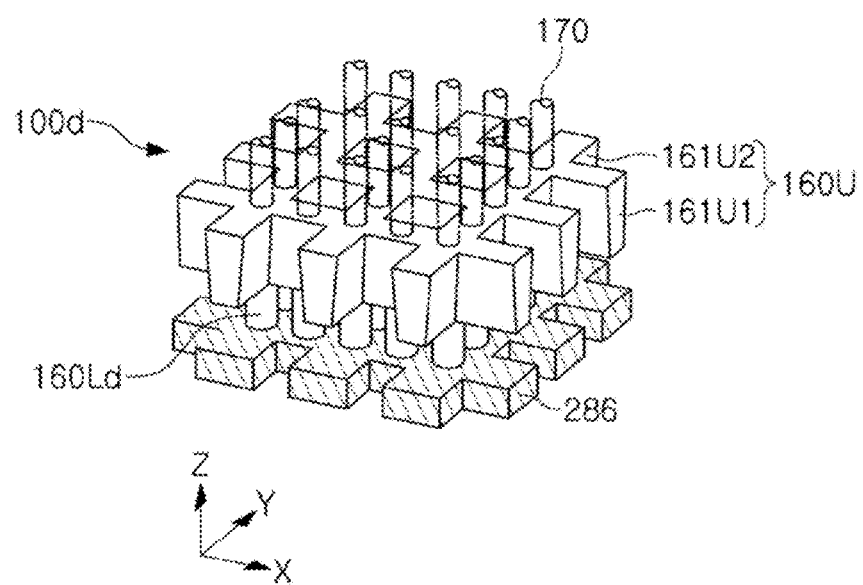

FIGS. 7A and 7B are a cross-sectional view and a perspective view schematically illustrating a semiconductor device according to example embodiments, respectively. FIG. 7A illustrates a cross-section corresponding to FIG. 2B, and FIG. 7B illustrates a region corresponding to FIG. 4.

Referring to FIGS. 7A and 7B, in a via pad 160d of a semiconductor device 100d, a lower via pads 160Ld may be disposed in the form of a plurality of pad plugs having a cylindrical shape, rather than a line shape. Accordingly, the lower via pads 160Ld may include cylindrical pad plugs. The lower via pads 160Ld may be disposed between a third lower interconnection line 286, disposed therebelow in the form of crossed lines, and an upper via pad 160U disposed thereabove in the form of crossed lines. Positions of the lower via pads 160Ld may correspond to or differ from those of the through-vias 170.

As shown in FIGS. 7A and 7B, the upper via pad 160U may include first upper pad lines 160U1 and second upper pad lines 160U2, respectively constituting the first and second pad lines 160_1 and 160_2. As shown in at least FIG.

2A, the upper via pad 160U may be located at a height level corresponding to (e.g., at least partially a same height level as, at least partially overlapping in the X and/or Y directions, etc.) the second substrate 101, the horizontal insulating layer 110P, and the second horizontal conductive layer 104. As further shown in at least FIG. 2A, the lower via pad 160L (e.g., 160Ld) may be located at a same height level as (e.g., at least partially overlapping in the X and/or Y directions, etc.) at least a portion of the ground via 250. In example embodiments, the upper via pad 160U may also have a cylindrical shape, or only the upper via pad 160U may have a cylindrical shape. The shapes of the upper via pad 160U and the lower via pads 160Ld may be determined in consideration of a connection relationship to upper and lower structures, difficulty in process, pattern density, or the like.

Figure 8A:
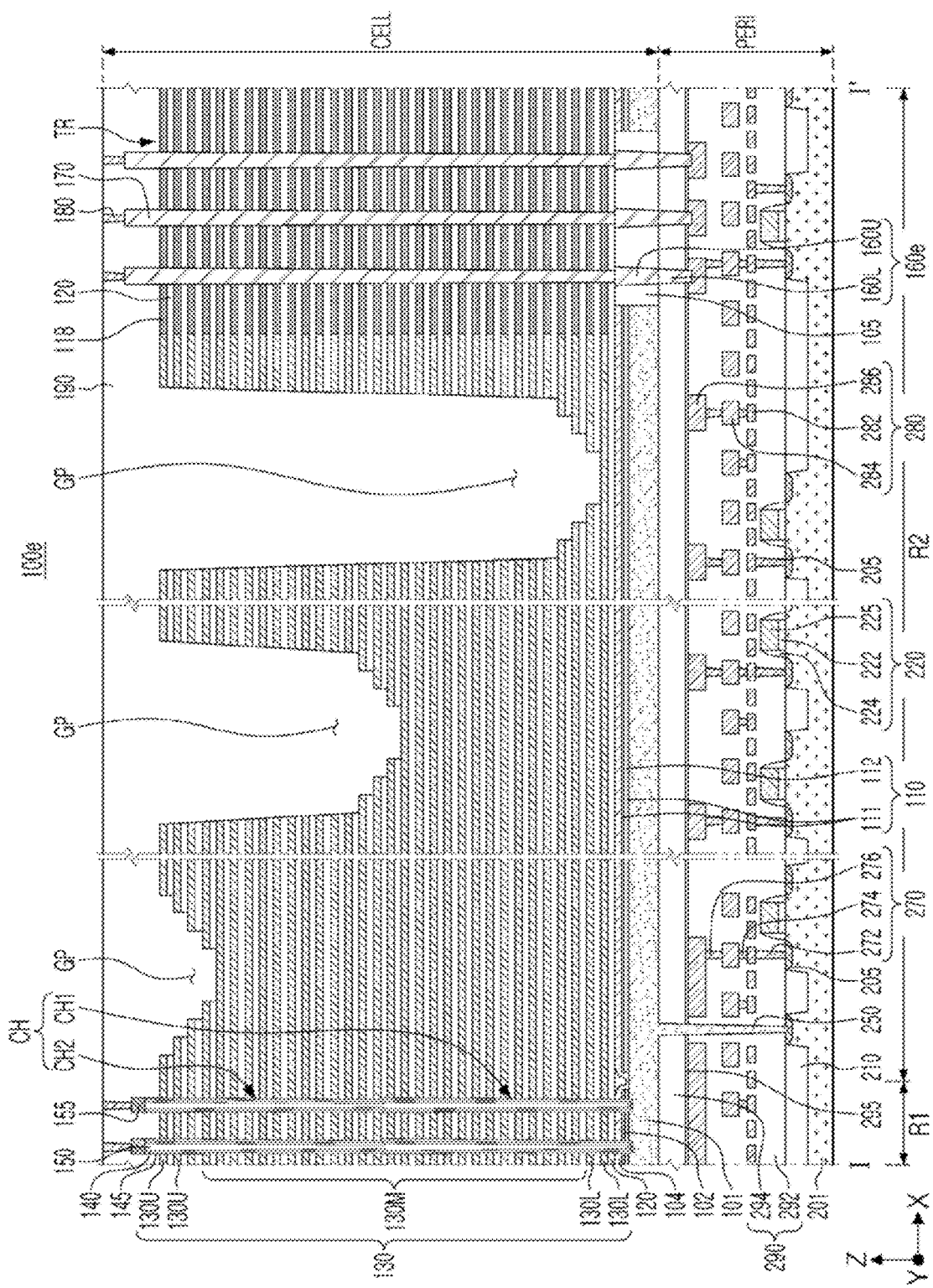
FIGS. 8A and 8B are cross-sectional views schematically illustrating a semiconductor device according to example embodiments.
Figure 8B:
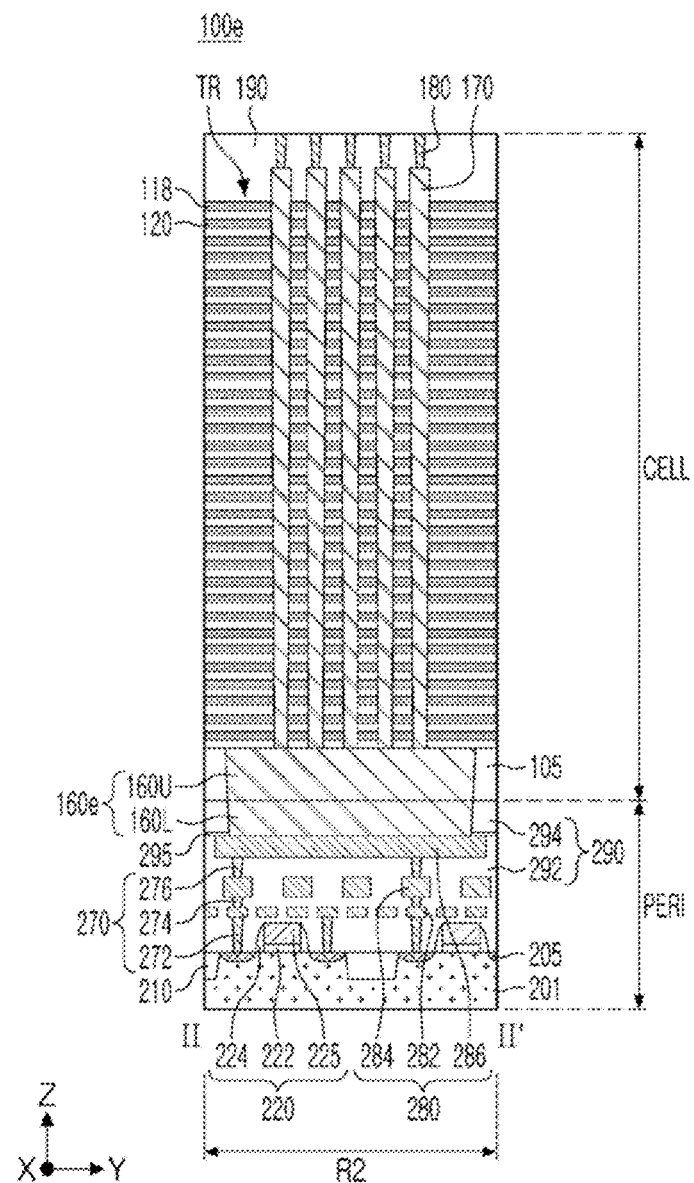

FIGS. 8A and 8B are cross-sectional views schematically illustrating a semiconductor device according to example embodiments. FIGS. 8A and 8B illustrate cross-sections corresponding to FIGS. 2A and 2B, respectively.

Referring to FIGS. 8A and 8B, a via pad 160e of a semiconductor device 100e may have a structure in which a horizontal insulating layer 110P does not remain, unlike the example embodiments of FIGS. 2A to 2C. Thus, an upper via pad 160U may have an inclined or vertical side surface without being bent.

In example embodiments, the via pad 160e may not include horizontal insulating layer 110P therein as in the present example embodiments. Alternatively, a portion of the horizontal insulating layer 110P may be removed, so that the horizontal insulating layer 110P may remain in a form different from that of the example embodiments of FIGS. 2A to 2C.

Figure 9A:
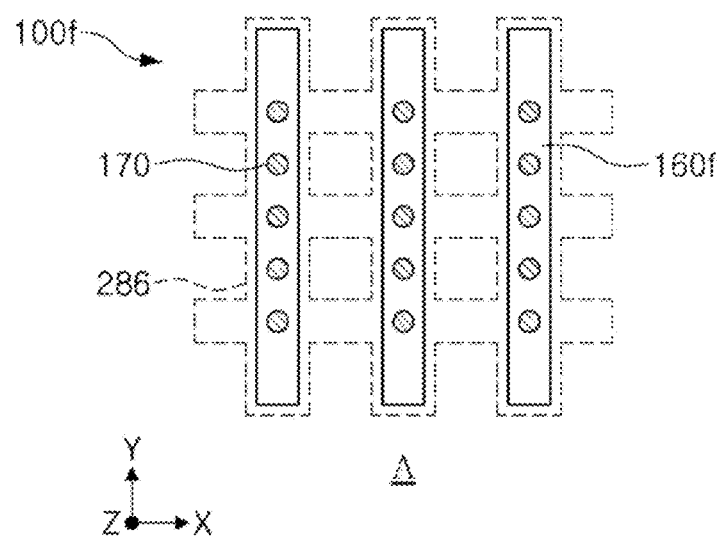
FIGS. 9A and 9B are plan views schematically illustrating semiconductor devices according to example embodiments.
Figure 9B:
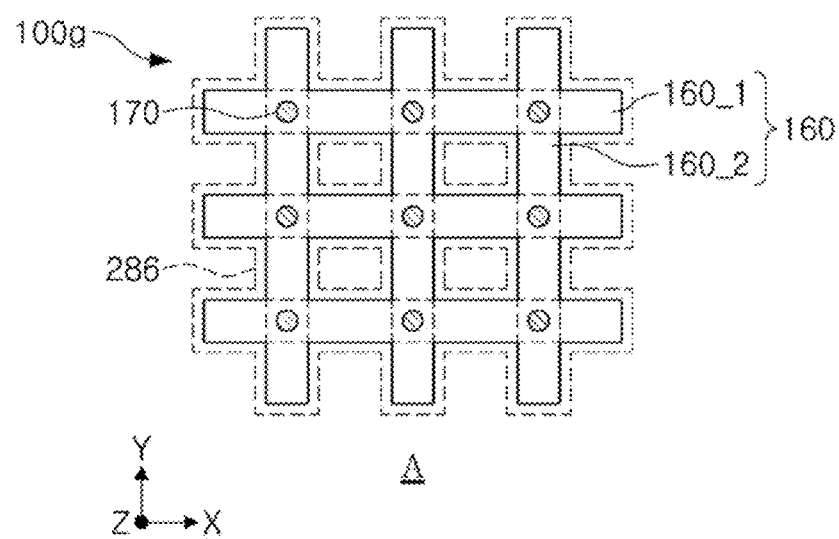

FIGS. 9A and 9B are plan views schematically illustrating semiconductor devices according to example embodiments. FIGS. 9A and 9B illustrate planes corresponding to region "A" of FIG. 1.

Referring to FIG. 9A, in a semiconductor device 100f, a via pad 160f may include only pad lines extending in one direction, for example, a Y direction. Even when a third lower interconnection line 286 is disposed in a grid shape, the via pad 160f may be disposed in the above manner to correspond only to a portion of the third lower interconnection line 286. In some example embodiments, the via pad 160f may include only pad lines extending in one direction, for example, an X direction.

Referring to FIG. 9B, in a semiconductor device 100g, through-vias 170 may be disposed only in a region in which first pad lines 160_1 and the second pad lines 160_2 intersect each other. The disposition of the through-vias 170 may vary according to example embodiments. In example embodiments, the through-vias 170 may be disposed only on the first pad lines 160_1 or only on the second pad lines 160_2.

Figure 10:
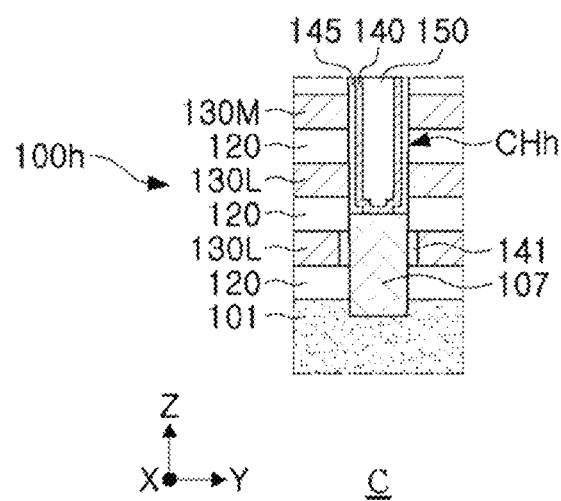
FIG. 10 is a cross-sectional view schematically illustrating a semiconductor device according to example embodiments.

FIG. 10 is a cross-sectional view schematically illustrating a semiconductor device according to example embodiments. FIG. 10 illustrates an enlarged cross-section corresponding to region "C" of FIG. 2C.

Referring to FIG. 10, in a semiconductor device 100h, a memory cell region CELL may not include first and second horizontal conductive layers 102 and 104 on a second substrate 101, unlike in the example embodiments of FIGS. 2A to 2C. In addition, a channel structure CHh may further include an epitaxial layer 107.

The epitaxial layer 107 may be disposed on the second substrate 101 one a lower end of the channel structure CHh and may be disposed on a side surface of at least one lower gate electrode 130L. The epitaxial layer 107 may be disposed in a recessed region of the second substrate 101. A height of the lower surface of the epitaxial layer 107 may be higher than a height of an upper surface of a lowermost lower gate electrode 130L and lower than a height of a lower surface of a lower gate electrode 130L disposed thereabove, but example embodiments are not limited thereto. The epitaxial layer 107 may be connected to the channel layer 140 through an upper surface thereof. A gate insulating layer 141 may be further disposed between the epitaxial layer 107 and the lowermost lower gate electrode 130L in contact with the epitaxial layer 107.

Figure 11:
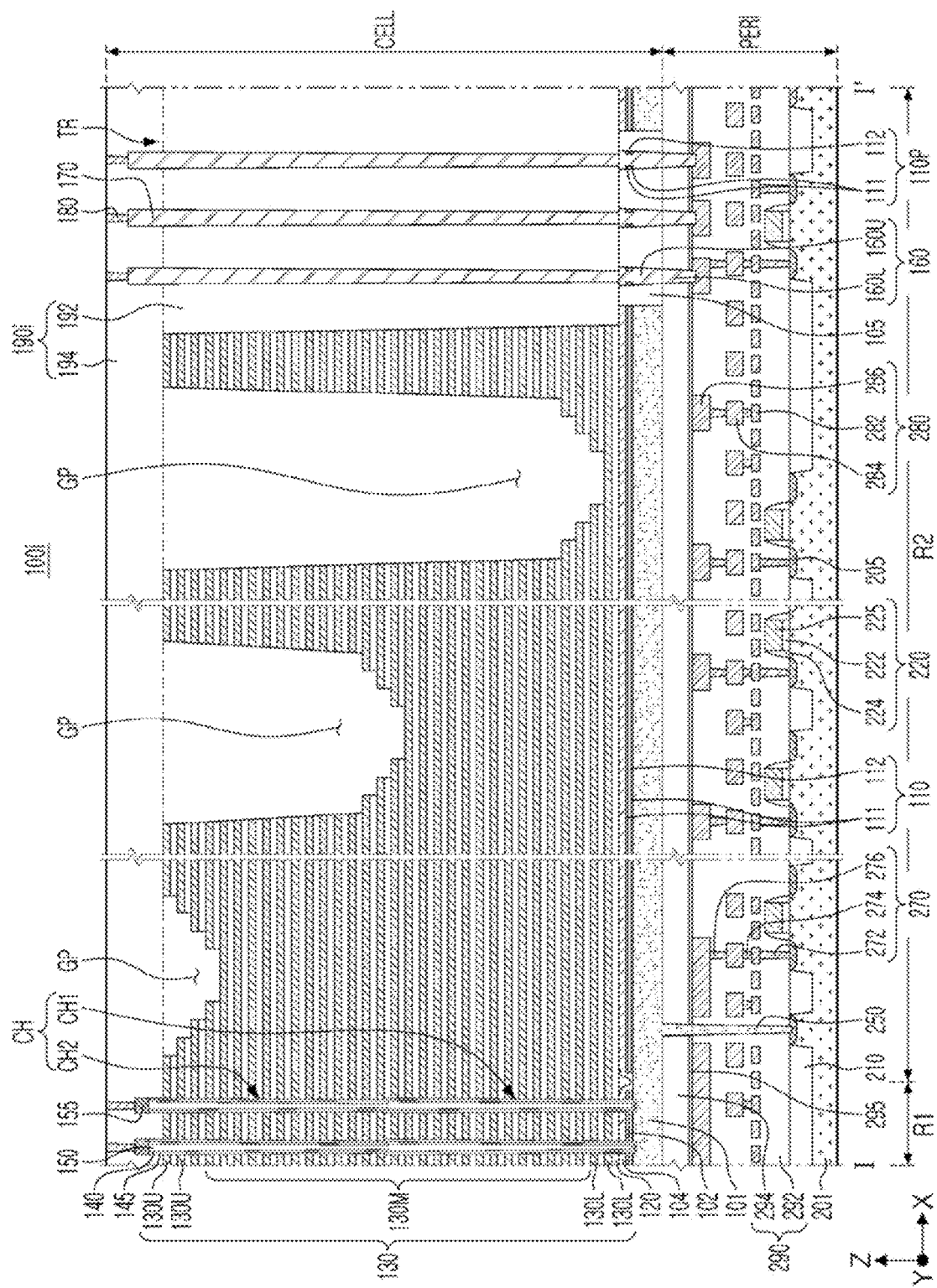
FIG. 11 is a cross-sectional view schematically illustrating a semiconductor device according to example embodiments.

FIG. 11 is a cross-sectional view schematically illustrating a semiconductor device according to example embodiments. FIG. 11 illustrates a cross-section corresponding to FIG. 2A.

Referring to FIG. 11, in a semiconductor device 100i, an insulating region of a through-interconnection region TR may include a cell region insulating layer 190i. For example, unlike in the example embodiments of FIGS. 2A to 2C, sacrificial insulating layers 118 and interlayer insulating layers 120 may be removed and the cell region insulating layer 190i may be filled in the through-interconnection region TR. Accordingly, a through-vias 170 may be disposed to penetrate through the cell region insulating layer 190i. As described above, in example embodiments, the sacrificial insulating layers 118 (see FIG. 2A) may not extend in the through-interconnection region TR. Alternatively, in example embodiments, the sacrificial insulating layers 118 may be disposed only in a portion of the through-interconnection region TR.

The cell region insulating layer 190i may include a first cell region insulating layer 192, filling the through-interconnection region TR and a gate pad regions GP, and a second cell region insulating layer 194 on the first cell region insulating layer 192. However, each of the first cell region insulating layer 192 and the second cell region insulating layer 194 may also include a plurality of insulating layers.

FIGS. 12A, 12B, 12C, 12D, 12E, 12F, 12G, 12H, 12I, 12J, and 12K are schematic cross-sectional views illustrating a method of fabricating a semiconductor device according to example embodiments. In FIGS. 12A, 12B, 12C, 12D, 12E, 12F, 12G, 12H, 12I, 12J, and 12K, regions corresponding to the region illustrated in FIG. 2A are illustrated.

Figure 12A:
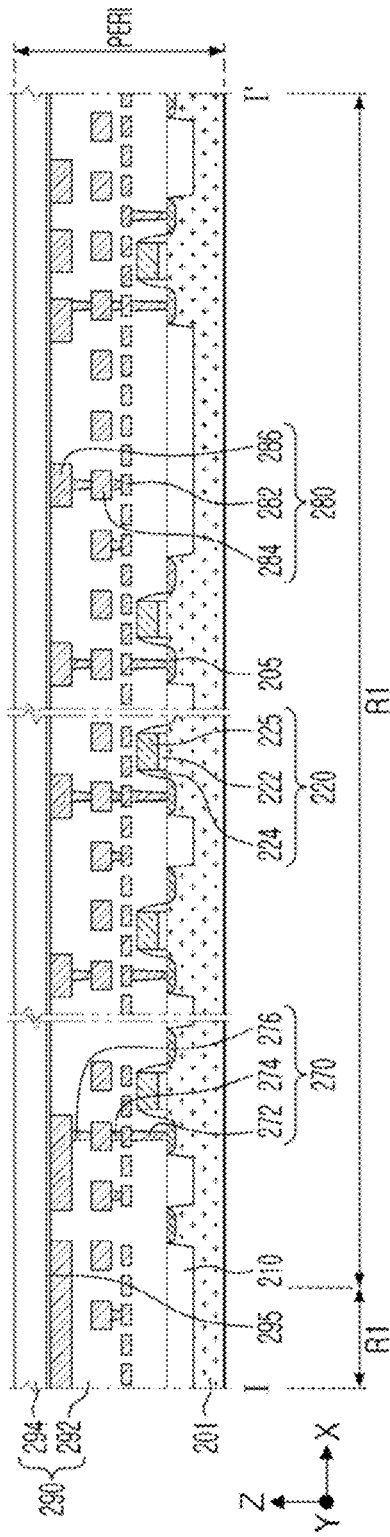
FIGS. 12A, 12B, 12C, 12D, 12E, 12F, 12G, 12H, 12I, 12J, and 12K are schematic cross-sectional views illustrating a method of fabricating a semiconductor device according to example embodiments.

Referring to FIG. 12A, circuit elements 220 and lower interconnection structure, constituting the peripheral circuit region PERI, may be formed on a first substrate 201.

Device isolation layers 210 may be formed in a first substrate 201, and a circuit gate dielectric layer 222 and a circuit gate electrode 225 may be sequentially formed on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or metal silicide, but example embodiments are not limited thereto. A spacer layer 224 and impurity regions 205 may be formed on opposite sidewalls of the circuit gate dielectric layer 222 and the circuit gate electrode 225. In example embodiments, the spacer layer 224 may include a plurality of layers. Then, an ion implantation process may be performed to form the impurity regions 205.

In a lower interconnection structure, lower contact plugs 270 may be formed by forming a portion of a first peripheral region insulating layer 292, etching a portion of the first peripheral region insulating layer 292 to be removed, and filling the removed portion with a conductive material. Lower interconnection lines 280 may be formed by, for example, depositing a conductive material and patterning the deposited conductive material.

The first peripheral region insulating layer 292 may include a plurality of insulating layers. The first peripheral region insulating layer 292 may be a portion in each operation of forming the lower interconnection structure. A lower passivation layer 295 may be formed on the first peripheral region insulating layer 292 to cover an upper surface of a third lower interconnection line 286. A second peripheral region insulating layer 294 may be formed on the lower passivation layer 295. Accordingly, the entirety of the peripheral circuit regions PERI may be formed.

Figure 12B:
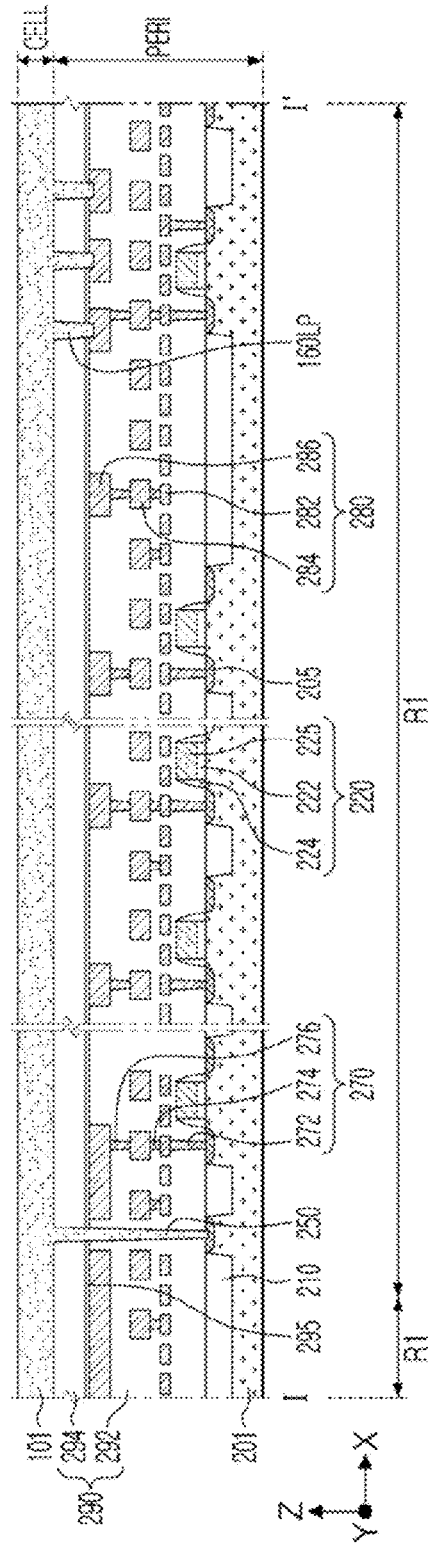

Referring to FIG. 12B, a second substrate 101 may be formed on the second peripheral region insulating layer 294, and a ground via 250 and a preliminary lower via pad 160LP may be formed together with a second substrate 101.

To form the ground via 250, a via hole extending from an upper surface of the second peripheral region insulating layer 294 to the impurity region 205 of the first substrate 201 may be formed. Pad openings, extending to the third lower interconnection line 286, may be formed in a region in a lower via pad 160L (see FIG. 2A) is formed together with the via hole. In example embodiments, when the pad openings are formed, the lower passivation layer 295 may function as an etch-stop layer.

The via hole and the pad openings may be filled with a material forming the second substrate 101, and a second substrate 101 may be formed thereon. Accordingly, the ground via 250 and a preliminary lower via pad 160LP may be formed. The preliminary lower via pad 160LP may be a layer replaced with the lower via pad 160L of FIG. 2A through a subsequent process. The second substrate 101, the ground via 250, and the preliminary lower via pad 160LP may be formed of, for example, polycrystalline silicon and may be formed by a CVD process.

Figures 12C, 12D:
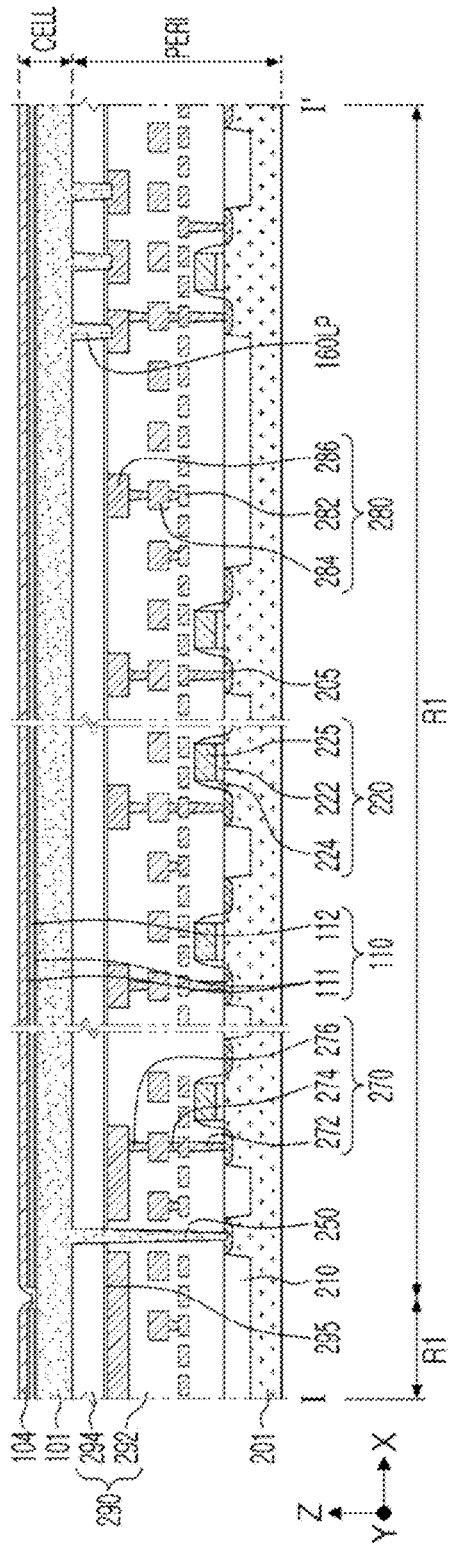

Referring to FIG. 12C, a horizontal insulating layer 110 and a second horizontal conductive layer 104 may be formed on the second substrate 101.

First and second horizontal insulating layers 111 and 112, constituting the horizontal insulating layer 110, may be alternately stacked on the second substrate 101. The horizontal insulating layer 110 may be a layer having a portion replaced with a first horizontal conductive layer 102 (see FIG. 2A) through a subsequent process. The first horizontal insulating layers 111 may include a material different from a material of the second horizontal insulating layer 112. For example, the first horizontal insulating layers 111 may be formed of the same material as the interlayer insulating layers 120, and the second horizontal insulating layer 112 may be formed of the same material as the subsequent sacrificial insulating layers 118. A portion of the horizontal insulating layer 110 may be removed by a patterning process in some regions, for example, in a second region R2 of the second substrate 101.

The second horizontal conductive layer 104 may be formed on the horizontal insulating layer 110 and may be in contact with the second substrate 101 in a region in which the horizontal insulating layer 110 is removed. Accordingly, the second horizontal conductive layer 104 may be bent along end portions of the horizontal insulating layer 110, may cover the end portions, and may extend upwardly of the second substrate 101.

Referring to FIG. 12D, a substrate structure of the second substrate 101, the horizontal insulating layer 110, and the second horizontal conductive layer 104 may be patterned, and a substrate insulating layer 105 may be formed.

A portion of the substrate structure including the second substrate 101 may be removed in a second region R2. In particular, a portion of the substrate structure may be removed in a region in which a through-interconnection region TR (see FIG. 2A) is disposed. The substrate structure may be patterned to remain as a structure corresponding to the via pad 160 (see FIG. 2A) in the region in which the through-interconnection region TR is disposed. Accordingly, a preliminary upper via pad 160UP may be formed on the preliminary lower via pad 160LP. An inclined profile of side surfaces of the preliminary lower via pad 160LP and the preliminary upper via pad 160UP may vary according to example embodiments.

The substrate insulating layer 105 may be formed by filling a region, in which the substrate structure is removed, with an insulating material. The insulating material may be deposited on the second horizontal conductive layer 104, and may then be planarized by a planarization process such as a chemical mechanical planarization (CMP) process to form the substrate insulating layer 105. For example, in the through-interconnection region TR, the preliminary upper via pads 160UP may be disposed in a grid shape in the substrate insulating layer 105 to reduce or prevent defects such as dishing from occurring during the CMP process.

Figure 12E:
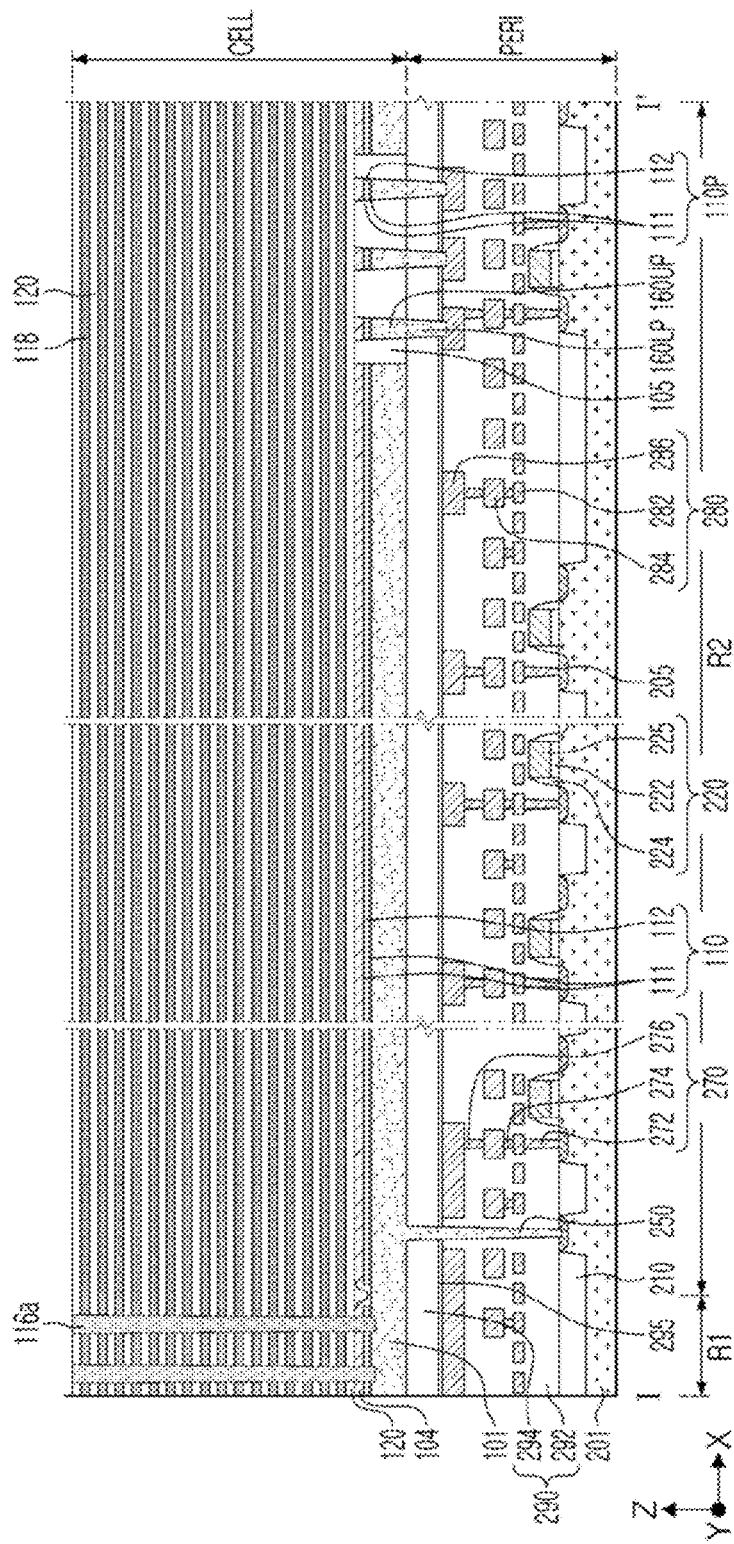

Referring to FIG. 12E, sacrificial insulating layers 118 and interlayer insulating layers 120 may be alternately stacked to form a lower stack structure, and first channel sacrificial layers 116*a* may be formed.

The lower tack structure may be formed on the second horizontal conductive layer 104 and the substrate insulating layer 105 at a height at which first channel structures CH1 (see FIG. 2A) is disposed. The sacrificial insulating layers 118 may be a layer having a portion replaced with gate electrodes 130 (see FIG. 2A) through a subsequent process. The sacrificial insulating layers 118 may be formed of a material different from a material of the interlayer insulating layers 120, and may be formed of a material etched with an etching selectivity with respect to the interlayer insulating layers 120 under specific etching conditions. For example, the interlayer insulating layer 120 may be formed of at least one of silicon oxide or silicon nitride, and the sacrificial insulating layers 118 may be formed of one selected from silicon, silicon oxide, silicon carbide, and silicon nitride, which may be different from the material of the interlayer insulating layer 120. In example embodiments, thicknesses of the interlayer insulating layers 120 may not all be the same. The thicknesses of the interlayer insulating layers 120 and the sacrificial insulating layers 118 and the number of layers constituting the interlayer insulating layers 120 and the sacrificial insulating layers 118 may be variously change from those illustrated.

A first channel sacrificial layers 116*a* may be formed in a positions corresponding to a first channel structures CH1 (see FIG. 2A) in the first region R1. The first channel sacrificial layers 116*a* may be formed by forming lower channel holes to penetrate through the lower stack structure, depositing a material forming first channel sacrificial layers 116*a* in the lower channel holes, and performing a planarization process. The first channel sacrificial layers 116*a* may include, for example, polycrystalline silicon.

Since the substrate insulating layer 105 has a planar upper surface, the lower stack structure may also be formed without being bent or warped during the present operation. Thus, defects such as the material of the first channel sacrificial layers 116a remaining on the substrate insulating layer 105 may be reduced or prevented.

Figure 12F:
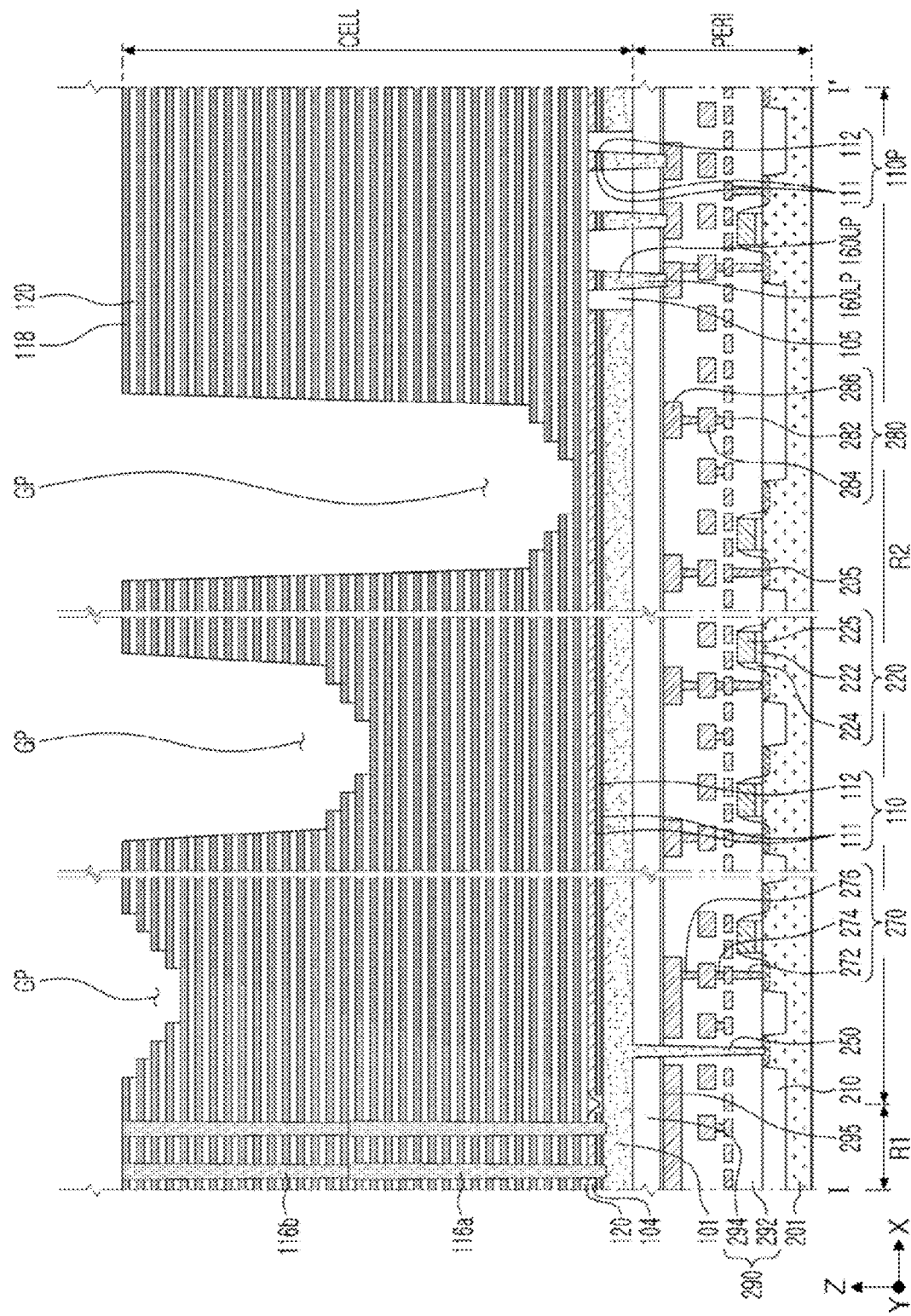

Referring to FIG. 12F, sacrificial insulating layers 118 and interlayer insulating layers 120 constituting an upper stack structure may be alternately stacked on the lower stack structure, and second channel sacrificial layers 116b may be formed, and then gate pad regions GP may be formed.

In the present operation, the upper stack structure may be formed on the lower stack structure at a height at which second channel structures CH2 (see FIG. 2A) are disposed. The second channel sacrificial layers 116b may be formed in positions corresponding to positions of the second channel structures CH2 in the first region R1. The second channel sacrificial layers 116b may be formed to be respectively connected to the first channel sacrificial layers 116a. The second channel sacrificial layers 116b may be formed by depositing the same material as the first channel sacrificial layers 116a, for example, polycrystalline silicon.

A photolithography process and an etching process may be repeatedly performed on the sacrificial insulating layers 118 and the interlayer insulating layers 120 to form gate pad regions GP. The gate pad regions GP may be formed in the second region R2, and may be formed to include a region in which the sacrificial insulating layers 118 disposed thereabove extend less than the sacrificial insulating layers 118 disposed therebelow. In each of the gate pad regions GP, a step structure may be formed such that upper surfaces and end portions of the plurality of sacrificial insulating layers 118 are exposed upwardly. However, specific shapes of the gate pad regions GP may vary according to example embodiments.

Figure 12G:
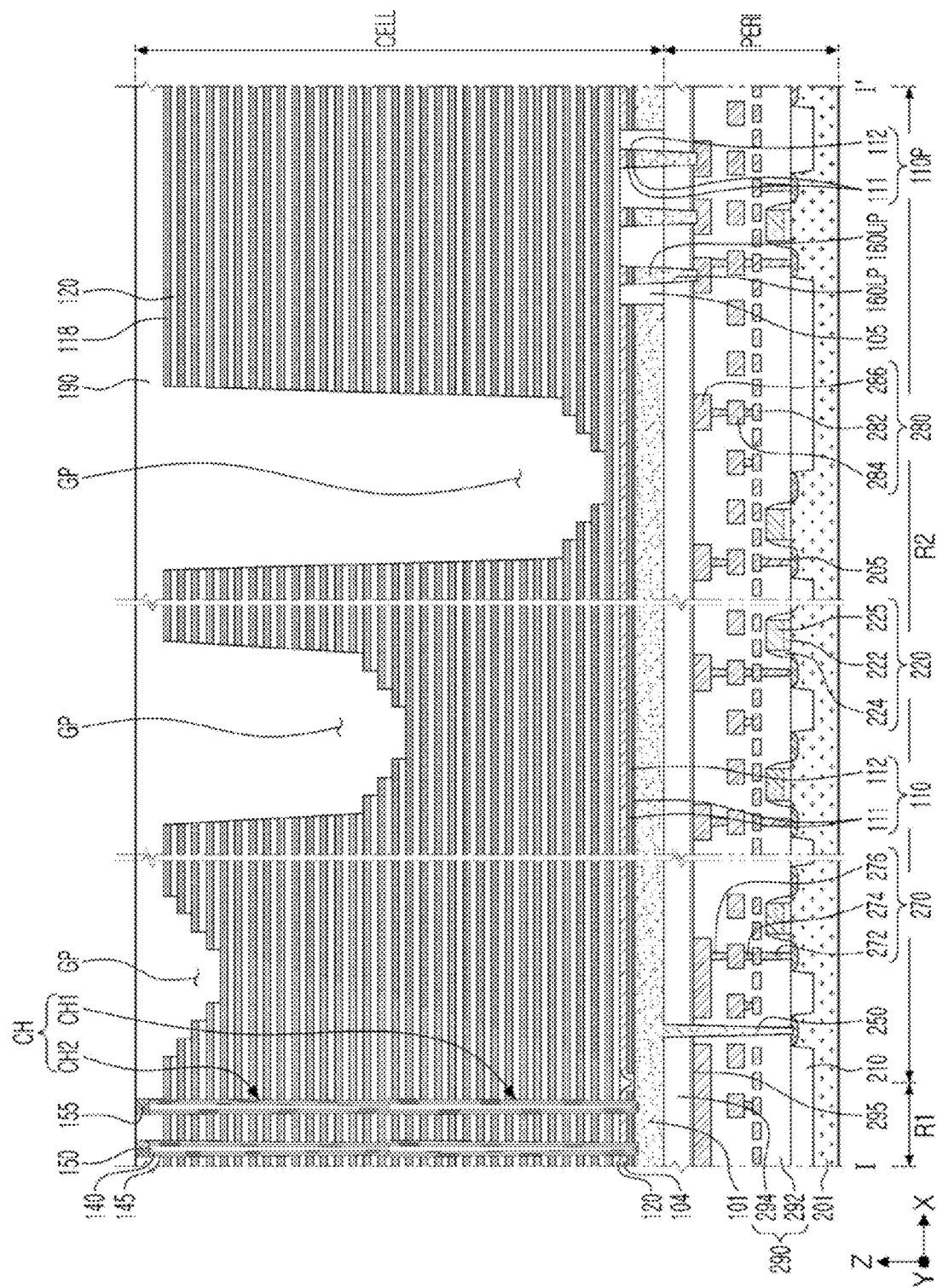

Referring to FIG. 12G, channel structures CH may be formed to penetrate through the lower stack structure and the upper stack structure.

A cell region insulating layer 190 may be formed to cover the lower stack structure and the upper stack structure. Next, portions of the sacrificial insulating layers 118 and the interlayer insulating layers 120 may be removed to form upper separation regions SS (see FIG. 2C). The upper separation regions SS are formed by removing a predetermined or alternatively, desired number of sacrificial insulating layers 118 and interlayer insulating layers 120 from above, and then depositing an insulating material to form an upper insulating layer 103 (see FIG. 2C).

The channel structures CH may be formed by anisotropically etching the sacrificial insulating layers 118 and the interlayer insulating layers 120 using a mask layer, and may be formed by forming hole-shaped channel holes and then filling the channel holes. When the channel holes are formed using a plasma dry etching process, a potential difference may occur in upper and lower portions of the channel holes due to ions generated in the channel holes. However, since the second horizontal conductive layer 104 and the second substrate 101 are connected to the first substrate 201 by the ground via 250, for example, positive charges may flow to the first substrate 201 and negative charges moving through the mask layer may flow from an edge of a wafer to the first substrate 201 to reduce or prevent an arcing failure caused by the potential difference.

Due to the height of the stack structure, sidewalls of the channel structures CH may not be perpendicular to an upper surface of the second substrate 101. The channel structures CH may be formed to recess a portion of the second substrate 101. Next, at least a portion of a gate dielectric layer 145, a channel layer 140, a channel buried insulating layer 150, and a channel pad 155 may be sequentially formed in the channel structures CH.

The gate dielectric layer 145 may be formed to have a uniform thickness using an ALD or CVD process. In the present operation, the entirety or a portion of the gate dielectric layer 145 may be formed, and a portion extending in a direction perpendicular to the second substrate 101 along the channel structures CH may be formed. The channel layer 140 may be formed on the gate dielectric layer 145 in the channel structures CH. The channel buried insulating layer 150 may be formed to fill the channel structures CH, and may include an insulating material. The channel pad 155 may be formed of a conductive material, for example, polycrystalline silicon.

Figure 12H:
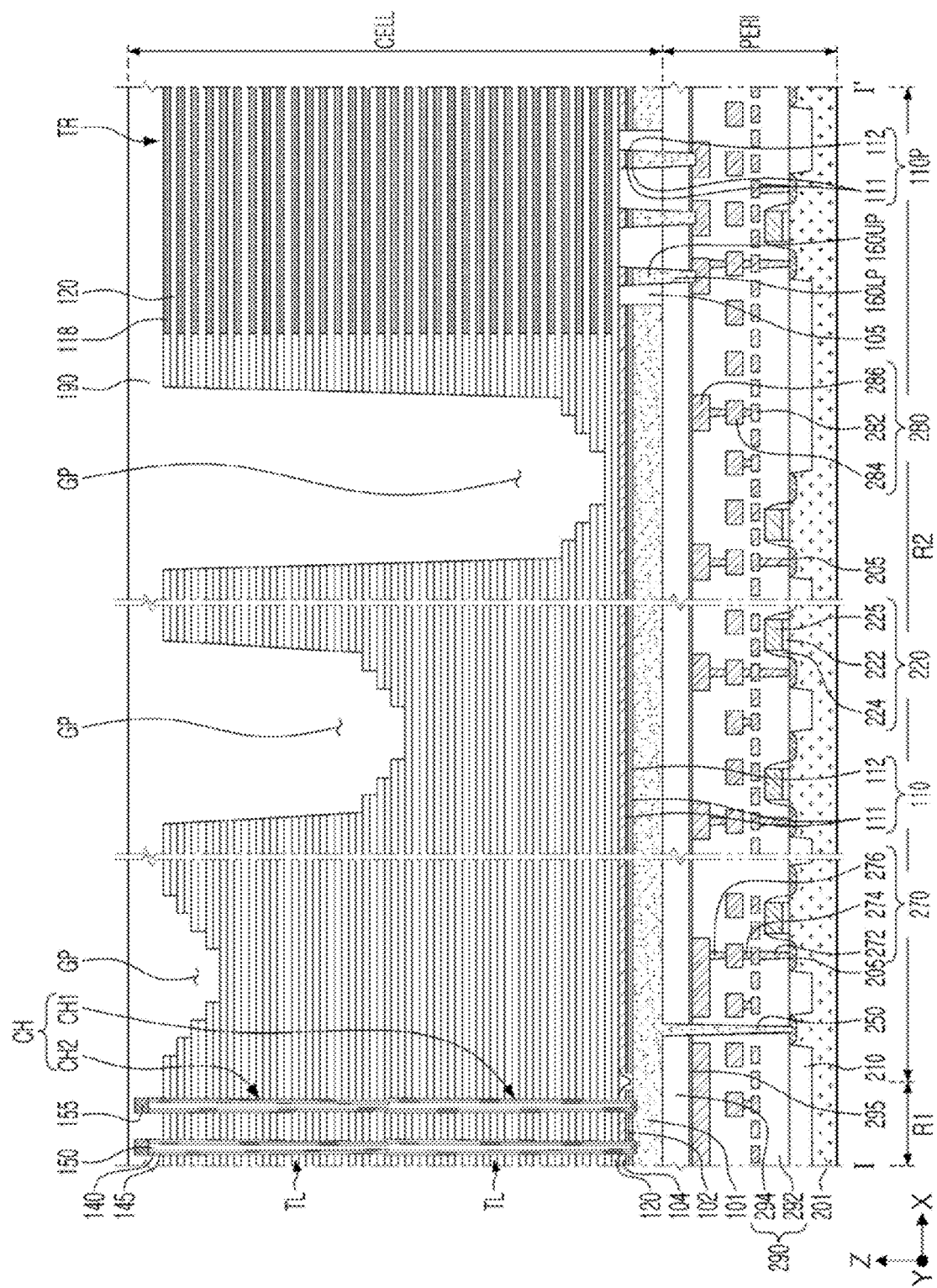

Referring to FIG. 12H, in regions corresponding to the separation regions MS (see FIG. 1), openings may be formed to penetrate through the stack structure of the sacrificial insulating layers 118 and the interlayer insulating layers 120. A portion of the sacrificial insulating layers 118 may be removed through the openings to form tunnel portions TL.

Cell region insulating layer 190 may be additionally formed. The openings may be formed to penetrate through the stack structure of the sacrificial insulating layers 118 and the interlayer insulating layers 120 and to penetrate through the second horizontal conductive layer 104 therebelow. Next, an etch-back process is performed while forming separate sacrificial spacer layers in the openings, so that the horizontal insulating layer 110 may be selectively removed in the first region R1 and a portion of the exposed gate dielectric layer 145 may also be removed together. A first horizontal conductive layer 102 may be formed by depositing a conductive material in the region in which the horizontal insulating layer 110 is removed, and then the sacrificial spacer layers may be removed in the openings. By the present process, the first horizontal conductive layer 102 may be formed in the first region R1.

Next, the sacrificial insulating layers 118 may be removed on the outside of the through-interconnection region TR. The sacrificial insulating layers 118 may remain in the through-interconnection region TR to constitute an insulating region of the through-interconnection region TR together with the interlayer insulating layers 120. The sacrificial insulating layers 118 may be selectively removed with respect to the interlayer insulating layers 120 using, for example, wet etching. Accordingly, a plurality of tunnel portions TL may be formed between the interlayer insulating layers 120. A region, in which the through-interconnection region TR is formed, may be a region in which the sacrificial insulating layers 118 remain because the region is spaced apart from the openings to the outside, for example, in the X direction to reduce or prevent an etchant from reaching the region.

Figure 12I:
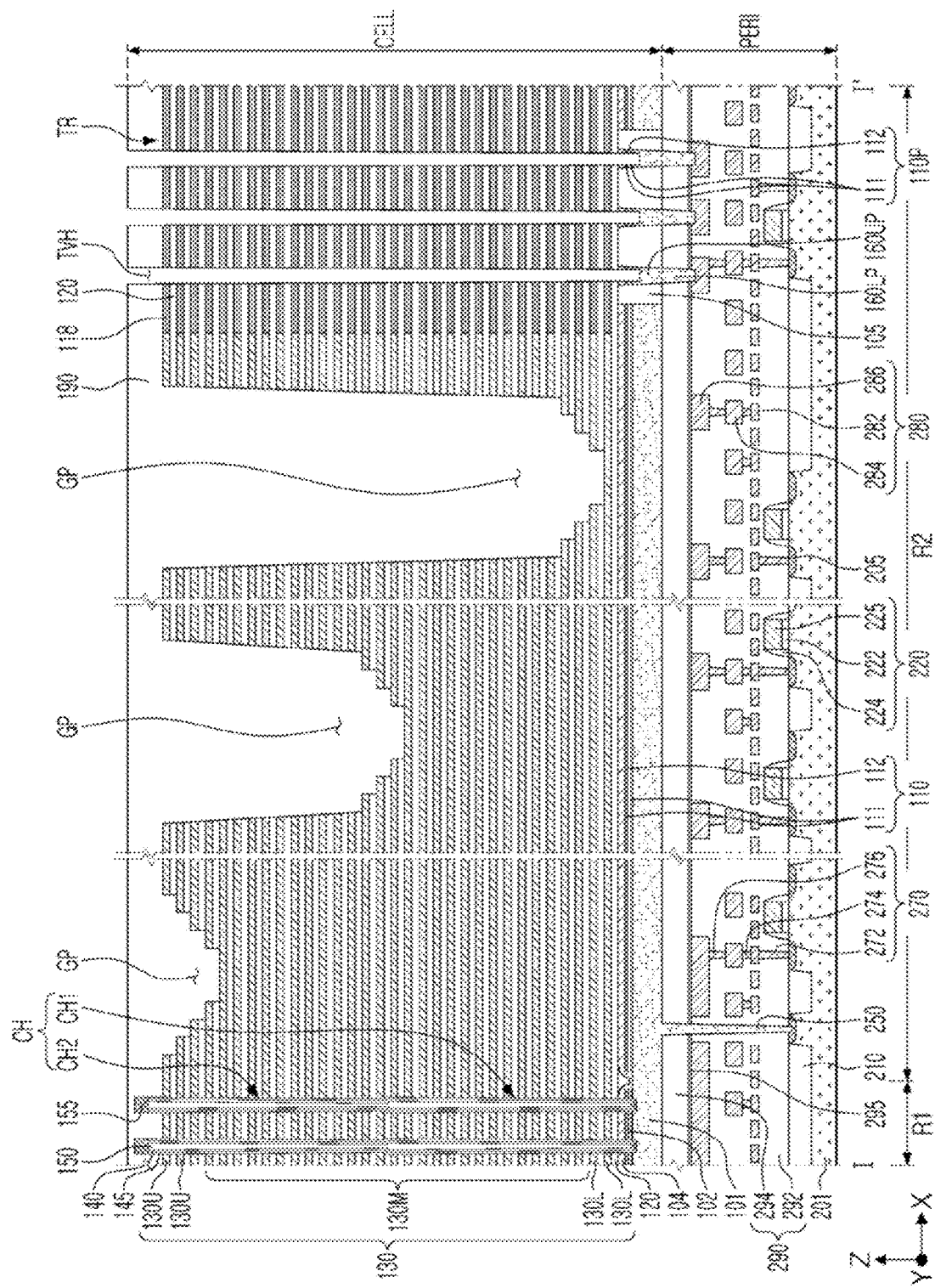

Referring to FIG. 12I, the gate electrodes 130 may be formed by filling the tunnel portions TL, in which a portion of the sacrificial insulating layers 118 is removed, with a conductive material, and via holes TVH may be formed.

The conductive material, forming the gate electrodes 130, may fill the tunnel portions TL. Side surfaces of the gate electrodes 130 may be in contact with side surfaces of the sacrificial insulating layers 118 of the through-interconnection region TR. The conductive material may include a metal, polycrystalline silicon, or a metal silicide material. After the gate electrodes 130 are formed, the conductive material deposited in the openings may be removed by an additional process, and then the openings may be filled with an insulating material to form a separation insulating layer 106 (see FIG. 2C). In example embodiments, the process of removing the sacrificial insulating layers 118 and the process of forming the gate electrodes 130 may be performed after through-vias 170 (see FIG. 2A) are formed.

Next, the via holes TVH may be formed in regions corresponding to the through-vias 170. The via holes TVH may be formed to penetrate through the sacrificial insulating layers 118 and the interlayer insulating layers 120 in the through-interconnection region TR, and to penetrate through a portion of the preliminary upper via pad 160UP. In particular, the via holes TVH may be formed to penetrate through the horizontal insulating layer 110 constituting the preliminary upper via pad 160UP. The preliminary upper via pad 160UP below the horizontal insulating layer 110 may be exposed through bottom surfaces of the via holes TVH. Lower ends of the via holes TVH may be disposed on a level overlapping the second substrate 101 in the X direction.

Figure 12J:
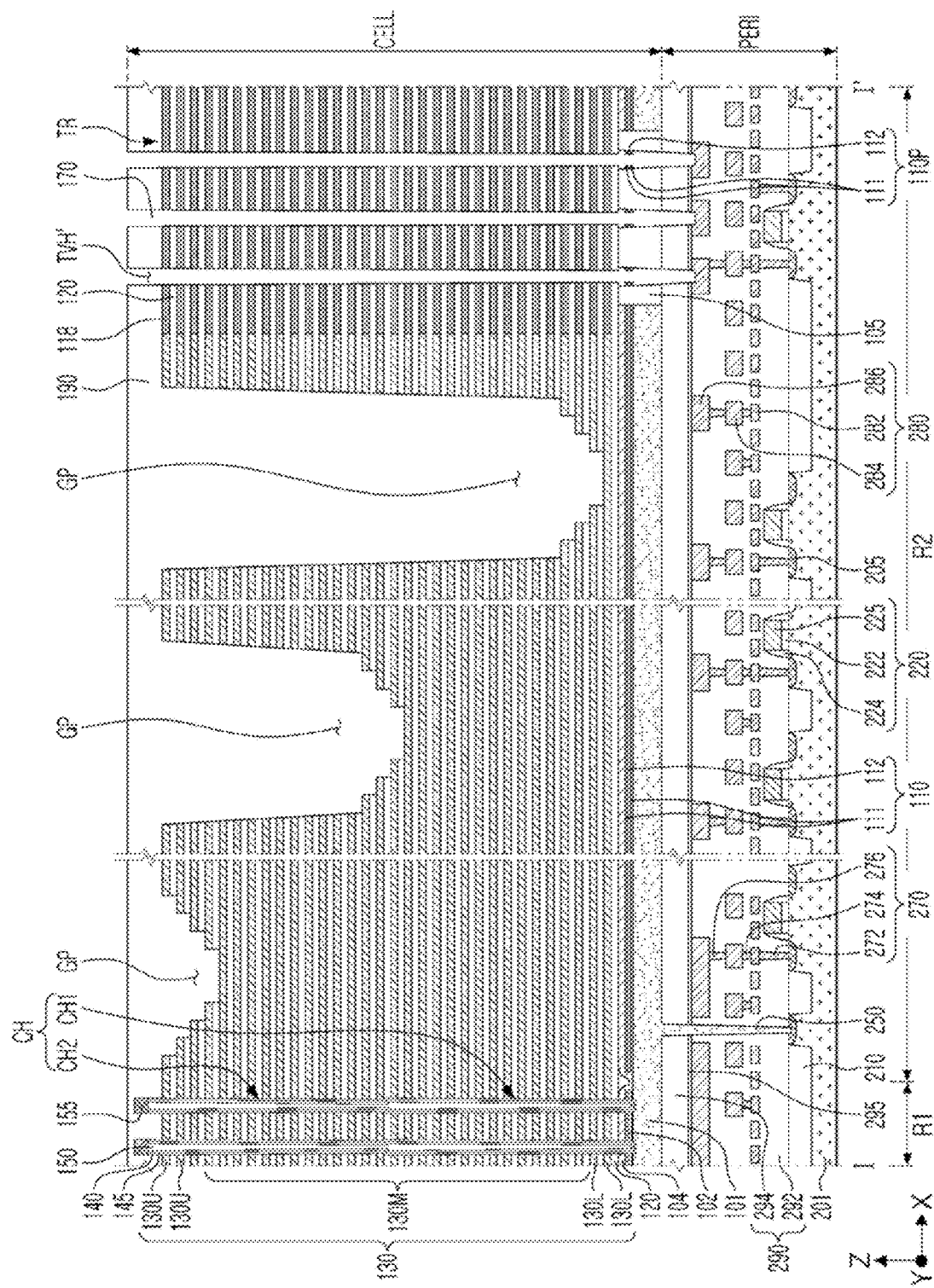

Referring to FIG. 12J, the preliminary upper via pad 160UP exposed through the via holes TVH may be removed, and the preliminary lower via pad 160LP below the preliminary upper via pad 160UP may be removed.

The preliminary upper via pad 160UP and the preliminary lower via pad 160LP may be selectively removed with respect to the substrate insulating layer 105, the horizontal insulating layer 110, and the third lower interconnection line 286. Accordingly, an extending via hole TVH' may be formed to extend from the via hole TVH. The preliminary upper via pad 160UP and the preliminary lower via pad 160LP may be removed by, for example, wet etching. By the wet etching, for example, silicon (Si) may be selectively removed to form the extending via hole TVH'.

In the example embodiments of FIGS. 6A and 6B, in the present operation, a portion of the preliminary upper via pad 160UP and the preliminary lower via pad 160LP may remain in an end portion to fabricate the semiconductor device. In the example embodiments of FIGS. 8A and 8B, in the present operation, the horizontal insulating layer 110 may be removed together to fabricate the semiconductor device.

Figure 12K:
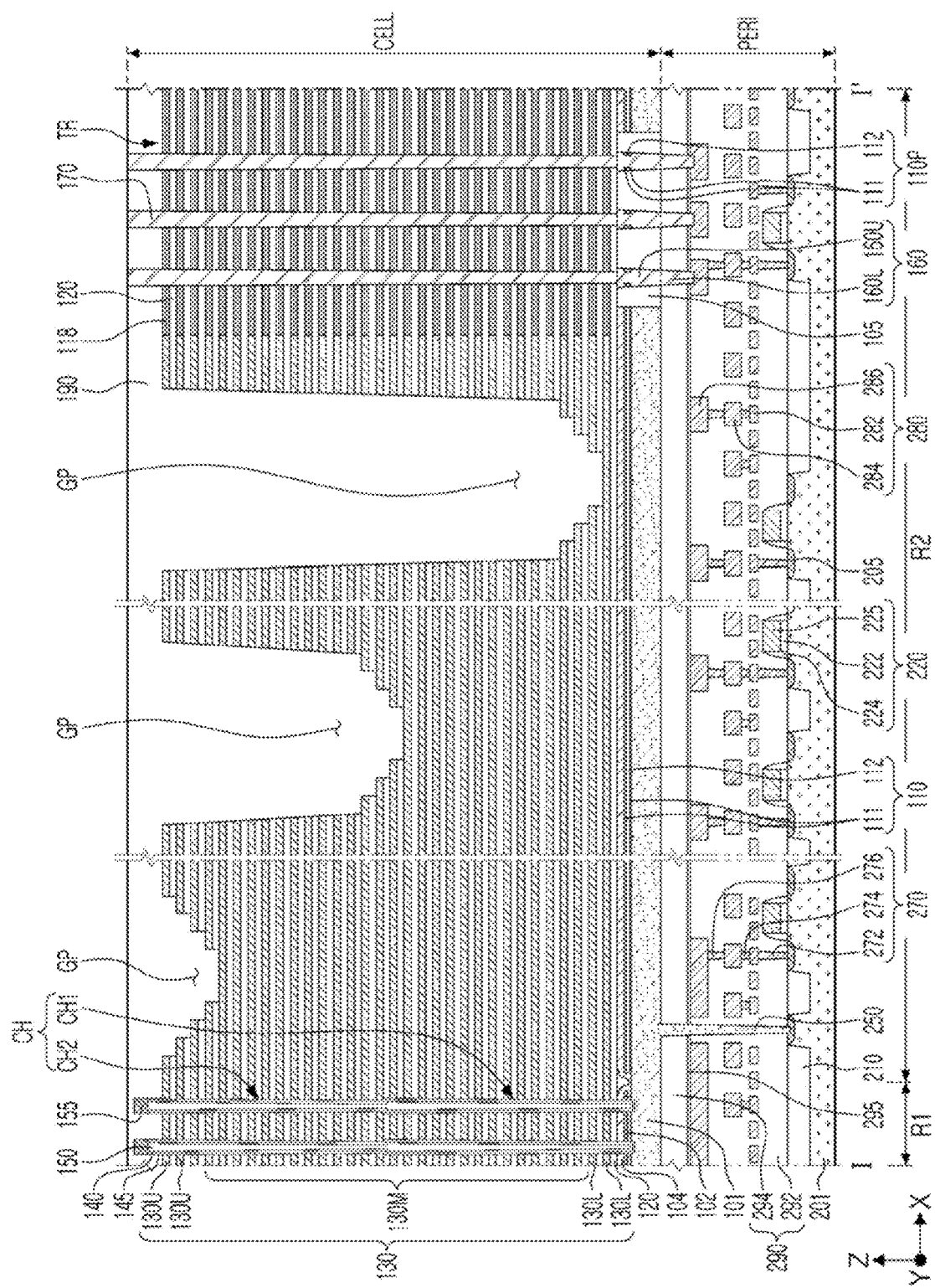

Referring to FIG. 12K, the extending via hole TVH' may be filled with a conductive material to form a via pad 160 and through-vias 170.

The via pad 160 and the through-vias 170 may be formed together in a single deposition process. The via pad 160 and the through-vias 170 may include a metal material, for example, tungsten (W). The via pad 160 and the through-vias 170 may include the same material as the third lower interconnection line 286, but example embodiments are not limited thereto.

According to example embodiments, the gate contact plugs 185 of FIG. 1 may be formed together with the through-vias 170. To this end, in the above operation described with reference to FIG. 12I, gate contact plug holes may be formed together with the via holes TVH, and then the conductive material may be deposited together in the present operation to form the gate contact plugs 185.

Next, referring to FIG. 2A together, cell region insulating layer 190 may be additionally formed, and then upper contact plugs 180 may be formed. The upper contact plugs 180 may be formed, for example, by depositing a conductive material after removing a portion of the cell region insulating layer 190. Additional contact plugs and/or interconnection lines may be further formed on the cell region insulating layer 190.

As a result, the semiconductor device 100 of FIGS. 1 to 3 may be fabricated.

Figure 13:
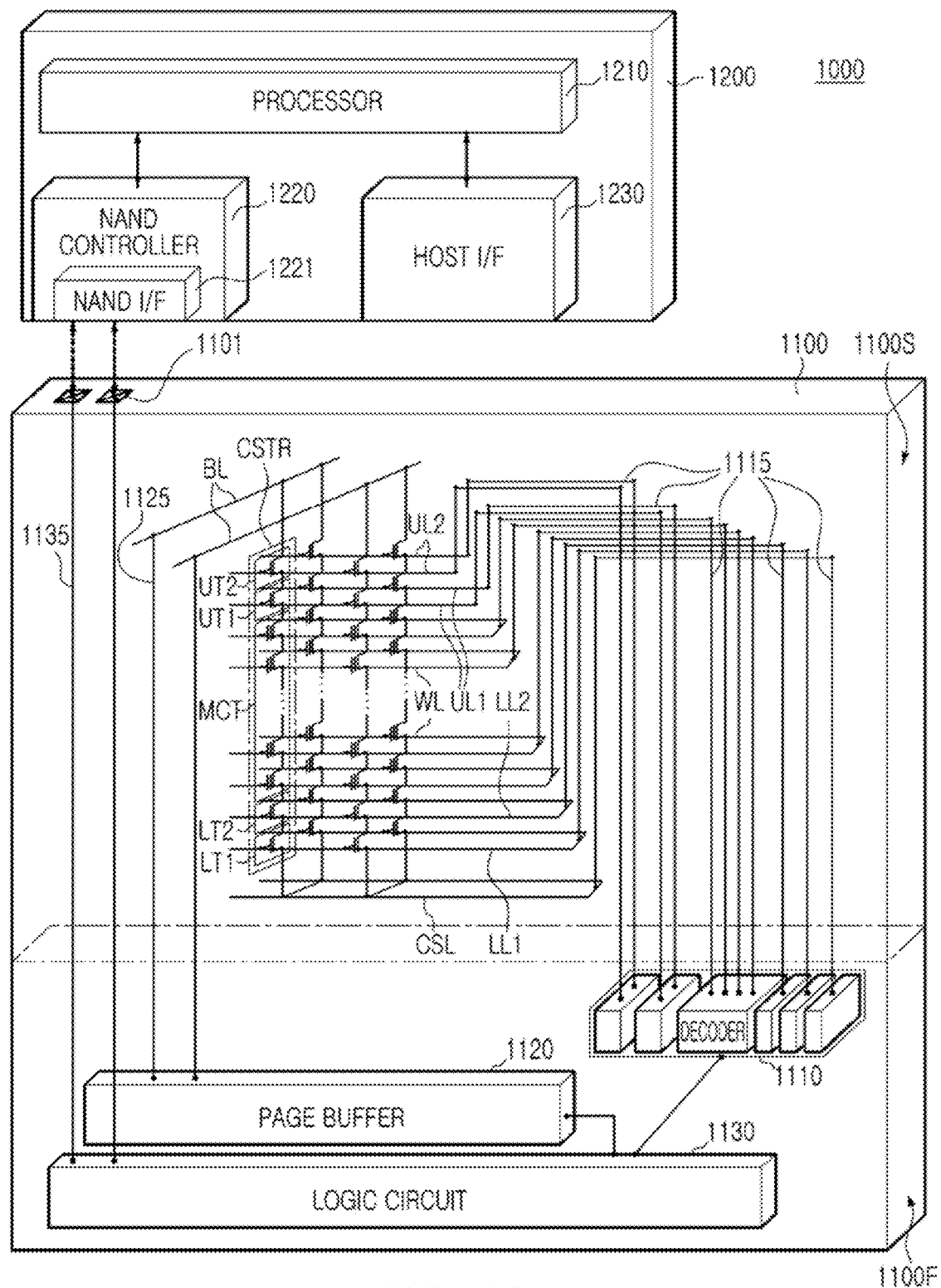
FIG. 13 is a view schematically illustrating a data storage system including a semiconductor device according to example embodiments.

FIG. 13 is a view schematically illustrating a data storage system including a semiconductor device according to example embodiments.

Referring to FIG. 13, a data storage system 1000 may include a semiconductor device 1100 and a controller 1200 electrically connected to the semiconductor device 1100. The data storage system 1000 may be a storage device, including one or more semiconductor devices 1100, or an electronic device including a storage device. For example, the data storage system 1000 may be or include a solid state drive device (SSD) device including one or more semiconductor devices 1100, a universal serial bus (USB), a computing system, a medical device, or a communications device.

The semiconductor device 1100 may be, may include, and/or may be included in a semiconductor device, semiconductor storage device, or the like according to any of the example embodiments. For example, the semiconductor device 1100 may be or may include any of the semiconductor devices 100, 100a to 100i, or the like according to any of the example embodiments. The semiconductor device 1100 may be or include a nonvolatile memory device and may be, for example, the NAND flash memory device described with reference to FIGS. 1 to 11. The semiconductor device 1100 may include a first structure 1100F and a second structure 1100S on the first structure 1100F. In example embodiments, the first structure 1100F (which may in some example embodiments referred to as a first semiconductor structure) may be disposed alongside the second structure 1100S (which may in some example embodiments referred to as a second semiconductor structure). In example embodiments, the first structure 1100F may be a peripheral circuit structure including a decoder circuit 1110, a page buffer 1120, and a logic circuit 1130. The second structure 1100S may a memory cell structure including a bitline BL, a common source line CSL, wordlines WL, first and second upper gate lines UL1 and UL2, first and second lower gate lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to example embodiments.

In example embodiments, the upper transistors UT1 and UT2 may include string select transistor, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 or the upper erase control transistor UT1 may be used in an erase operation in which data, stored in memory cell transistors MCT, is erased using gate-induced drain leakage (GIDL) current.

The common source line CSL, the first and second lower gate lines LL1 and LL2, the wordlines WL, and the first and second upper gate lines UL1 and UL2 may be electrically connected to the decoder circuit 1110 through first connection wirings 1115, extending to the second structure 1100S, within the first structure 1100F. The bitlines BL may be connected to the page buffer 1120 through second connection wirings 1125, extending to the second structure 1100S, within the first structure 1100F.

In the first structure 1100F, the decoder circuit 1110 and the page buffer 1120 may perform a control operation on at least one memory cell transistor MCT, among a plurality of memory cell transistors MCT. The decode circuit 1110 and the page buffer 1120 may be controlled by the logic circuit 1130. The data storage system 1000 may communicate with the controller 1200 through an input/output (I/O) pad 1101 electrically connected to the logic circuit 1130. The I/O pad 1101 may be electrically connected to the logic circuit 1130 through an input/output (I/O) connection wiring 1135, extending to the second structure 1100S, within the first structure 1100F. The I/O pad 1101 may be electrically connected to circuit elements 220 of a semiconductor device (e.g., semiconductor device 100) of the semiconductor device 1100.

The controller 1200 may be electrically connected to the semiconductor device 1100 through the I/O pad 1101. Thus, the controller 1200 may be electrically connected to a semiconductor device, semiconductor storage device, or the like that may be included in and/or at least partially comprise the semiconductor device 1100, through the I/O pad 1101. The controller 1200 may be configured to control the semiconductor device 1100 (e.g., via communicated with the semiconductor device 1100 via the I/O pad 1101). The controller 1200 may include a processor 1210, a NAND controller 1220, and a host interface 1230. According to example embodiments, the data storage system 1000 may include a plurality of semiconductor devices 1100. In some example embodiments, the controller 1200 may control the plurality of semiconductor devices 1100.

The processor 1210 may control overall operation of the data storage system 1000 including the controller 1200. The processor 1210 may operate based on predetermined or alternatively, desired firmware, and may control a NAND controller 1220 to access the semiconductor device 1100. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When a control command is received from the external host through the host interface 1230, the processor 1210 may control the semiconductor device 1100 in response to the control command.

Figure 14:
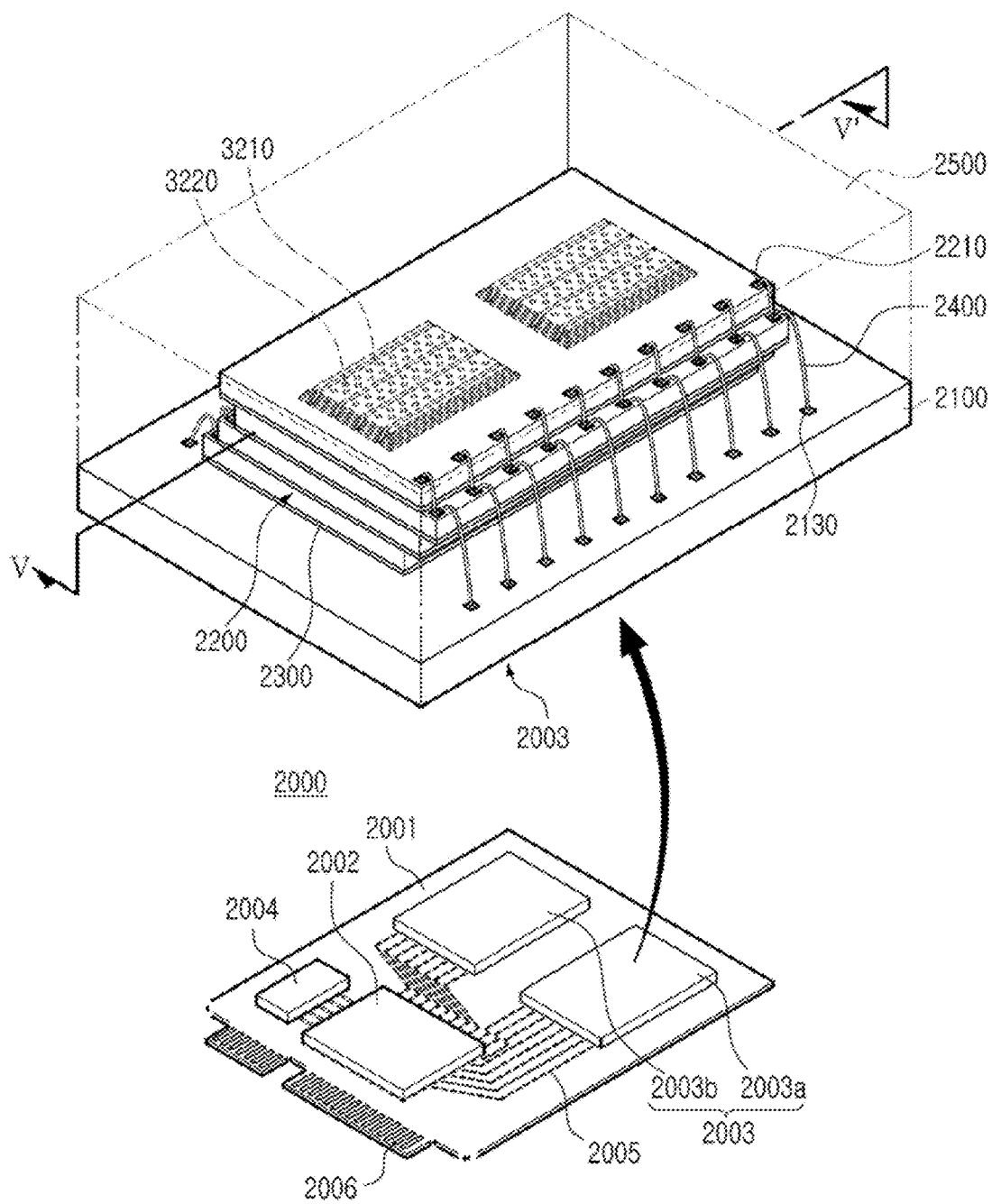
FIG. 14 is a perspective view schematically illustrating a data storage system including a semiconductor device according to example embodiments.

FIG. 14 is a perspective view schematically illustrating a data storage system including a semiconductor device according to example embodiments.

Referring to FIG. 14, a data storage system 2000 according to example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 through wiring patterns 2005 formed on the main substrate 2001.

The main substrate 2001 may include a connector 2006 including a plurality of pins coupled to the external host. In the connector 2006, the number and disposition of the plurality of pins may vary depending on a communications interface between the data storage system 2000 and the external host. In example embodiments, the data storage system 2000 may communicate with the external host based on an interface, among interfaces such as universal serial bus (USB), peripheral component interconnect express (PCI-Express), serial advanced technology attachment (SATA), M-PHY for universal flash storage (UFS), and the like. In example embodiments, the data storage system 2000 may operate with power supplied from the external host through a connector 2006. The data storage system 2000 may further include a power management integrated circuit (PMIC) dividing the power, supplied from the external host, to the controller 2002 and the semiconductor package 2003.

The controller 2002 may write data to the semiconductor package 2003 or read data from the semiconductor package 2003, and may increase operating speed of the data storage system 2000.

The DRAM 2004 may be a buffer memory for reducing a difference in speeds between the semiconductor package 2003, used as a data storage space, and the external host. The DRAM 2004, included in the data storage system 2000, may operate as a type of cache memory and may provide a space for temporarily storing data during a control operation for the semiconductor package 2003. When the DRAM 2004 is included in the data storage system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including an upper package pads 2130. Each of the semiconductor chips 2200 may include, and/or may be included in a semiconductor device, semiconductor storage device, or the like according to any of the example embodiments. Each of the semiconductor chips 2200 may be or may include any of the semiconductor devices 100, 100a to 100i, or the like according to any of the example embodiments. Each of the semiconductor chips 2200 may include an input/output (I/O) pad 2210. The I/O pad 2210 may correspond to the I/O pad 1101 of FIG. 13 and may be electrically connected to the circuit elements 220 of the semiconductor device(s) (e.g., semiconductor device 100) of and/or included in the semiconductor chips 2200. Each of the semiconductor chips 2200 may include gate stack structures 3210 and channel structures 3220. Each of the semiconductor chips 2200 may include the semiconductor device described with reference to FIGS. 1 to 11.

In example embodiments, the connection structure 2400 may be a bonding wire electrically connecting the I/O pad 2210 and the upper package pads 2130 to each other. Accordingly, in each of the first and second semiconductor packages 2003a and 2003b, the semiconductor chips 2200 may be electrically connected to each other by wire bonding, and may be electrically connected to the upper package pads 2130 of the package substrate 2100. According to example embodiments, in each of the first and second semiconductor packages 2003a and 2003b, the semiconductor chips 2200 may be electrically connected to each other by a connection structure including a through-silicon via (TSV), rather than the connection structure 2400 using wire bonding.

In example embodiments, the controller 2002 and the semiconductor chips 2200 may be included in a single package. In example embodiments, the controller 2002 and the semiconductor chips 2200 may be mounted on an additional interposer substrate, different from the main substrate 2001, and the controller 2002 and the semiconductor chips 2200 may be connected to each other by a wiring formed on the interposer substrate.

Figure 15:
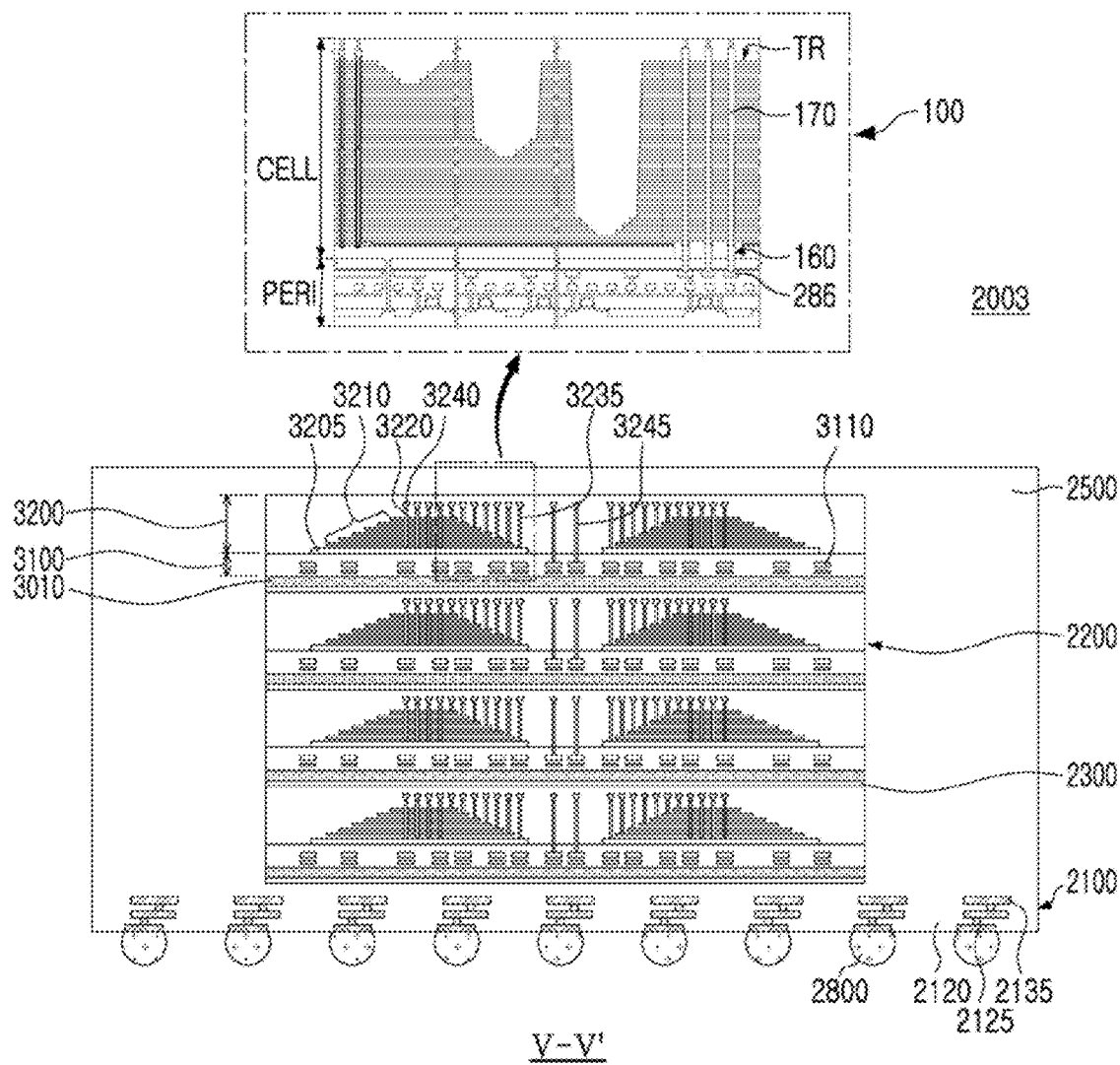
FIG. 15 is a cross-sectional view schematically illustrating a semiconductor package according to example embodiments.

FIG. 15 is a cross-sectional view schematically illustrating a semiconductor package according to example embodiments. FIG. 15 illustrates example embodiments of the semiconductor package 2003 of FIG. 14, and conceptually illustrates a region taken along line V-V of the semiconductor package 2003 of FIG. 14.

Referring to FIG. 15, in a semiconductor package 2003, a package substrate 2100 may be a printed circuit board (PCB). The package substrate 2100 may include a package substrate body portion 2120, upper package pads 2130 (see FIG. 14) disposed on an upper surface of the package substrate body portion 2120, lower pads 2125 disposed on a lower surface of the package substrate body portion 2120 or exposed through the lower surface of the package substrate body portion 2120, and internal wirings 2135 electrically connecting the upper package pads 2130 and the lower pads 2125 to each other inside the package substrate body portion 2120. The upper package pads 2130 may be electrically connected to the connection structures 2400. The lower pads 2125 may be connected to wiring patterns 2005 of the main substrate 2001 of the data storage system 2000, as illustrated in FIG. 14, through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may have a peripheral circuit region including peripheral wirings 3110. The second structure 3200 may include a common source line 3205, a gate stack structure 3210 on the common source line 3205, channel structures 3220 penetrating through the gate stack structure 3210, bitlines 3240 electrically connected to the channel structures 3220, and gate contact plugs 3235 electrically connected to wordlines WL (see FIG. 13) of the gate stack structure 3210. As described above with reference to FIGS. 1 to 11, in each of the semiconductor chips 2200, through-vias 170 of a through-wiring region TR may be disposed to be connected to a via pad 160 disposed therebelow.

Each of the semiconductor chips 2200 may include a through-wiring 3245 electrically connected to peripheral wirings 3110 of the first structure 3100 and extending inwardly of the second structure 3200. The through-wiring 3245 may be disposed on an external side of the gate stack structure 3210, and may be further disposed to penetrate through the gate stack structure 3210. Each of the semiconductor chips 2200 may further include an input/output (I/O) pad 2210 (see FIG. 14) electrically connected to the peripheral wirings 3110 of the first structure 3100.

As described above, a via pad horizontally spaced apart from a second substrate may be disposed on a lower end of a through-via. Accordingly, a semiconductor device having improved reliability and a data storage system including the same may be provided.

As described herein, any devices, systems, modules, units, controllers, circuits, and/or portions thereof according to any of the example embodiments (including, without limitation, the data storage system, semiconductor device 1100, controller 1200, decode circuit 1110, page buffer 1120, logic circuit 1130, processor 1210, NAND controller 1220, data storage system 2000, controller 2002, semiconductor packages 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the image sensor, including the functionality and/or methods performed by some or all of any devices, systems, modules, units, controllers, circuits, and/or portions thereof according to any of the example embodiments, and/or any portions thereof.

While example embodiments have been shown and described above, it will be apparent to those skilled in the art that modifications and variations could be made without departing from the scope of the present inventive concepts as defined by the appended claims.

What is claimed is:
1. A semiconductor device, comprising:
 a first semiconductor structure including
  a first substrate,
  circuit elements on the first substrate, and
  lower interconnection lines;
 a second semiconductor structure including
  a second substrate that is located on the first semiconductor structure and has a first region and a second region,
  gate electrodes spaced apart from each other and stacked on the second substrate in a first direction,
  interlayer insulating layers stacked alternately with the gate electrodes,
  a first horizontal conductive layer that is located below the gate electrodes on the first region,
  a horizontal insulating layer that is located below the gate electrodes on the second region,
  a second horizontal conductive layer on the first horizontal conductive layer and the horizontal insulating layer,
  channel structures penetrating through the gate electrodes in the first region and respectively including a channel layer, and
  separation regions penetrating through the gate electrodes and extending in a second direction; and a through-interconnection region including
sacrificial insulating layers that are located side by side with the gate electrodes in the second region and stacked alternately with the interlayer insulating layers,
through-vias penetrating through the sacrificial insulating layers and the interlayer insulating layers, extending in the first direction, and electrically connecting the gate electrodes and the circuit elements to each other, and
a via pad that is spaced apart from the second substrate and connects the through-vias and the lower interconnection lines to each other,
wherein the via pad includes
first pad lines that are extending in the second direction, and
second pad lines intersecting the first pad lines and extending in a third direction.

2. The semiconductor device of claim 1, wherein each of the through-vias has a first width, and each of the first pad lines and the second pad lines has a second width, greater than the first width, in a direction perpendicular to an extending direction.

3. The semiconductor device of claim 2, wherein the second width ranges from about 1.2 times to about 1.8 times the first width.

4. The semiconductor device of claim 1, wherein the horizontal insulating layer is interposed in at least one region in the via pad.

5. The semiconductor device of claim 4, wherein the via pad covers an upper surface and a lower surface of the horizontal insulating layer in the via pad.

6. The semiconductor device of claim 1, wherein the via pad has a grid shape in a plan view.

7. The semiconductor device of claim 1, wherein the lower interconnection lines below the via pad have a grid shape corresponding to the grid shape of the via pad.

8. The semiconductor device of claim 1, wherein the through-vias and the via pad include a first conductive material.

9. The semiconductor device of claim 8, wherein the via pad further includes a second conductive material that is located in a region including an end portion of the via pad, and the second conductive material is different from the first conductive material.

10. The semiconductor device of claim 8, wherein the second substrate and the second horizontal conductive layer include a second conductive material different from the first conductive material.

11. The semiconductor device of claim 1, wherein the via pad includes a lower via pad on the lower interconnection lines and an upper via pad that is located on the lower via pad.

12. The semiconductor device of claim 11, wherein the lower via pad and the upper via pad have different widths.

13. The semiconductor device of claim 11, wherein
the lower via pad includes cylindrical pad plugs, and
the upper via pad includes first and second upper pad lines, respectively constituting the first and second pad lines.

14. The semiconductor device of claim 11, wherein the upper via pad is located at a height level corresponding to the second substrate, the horizontal insulating layer, and the second horizontal conductive layer.

15. A semiconductor device, comprising:
a first substrate;
circuit elements that are located on the first substrate;
lower interconnection lines electrically connected to the circuit elements;
a second substrate that is located on the lower interconnection lines;
gate electrodes spaced apart from each other and stacked in a first direction on the second substrate, wherein the first direction is perpendicular to an upper surface of the second substrate;
channel structures penetrating through the gate electrodes, extending in the first direction, and respectively including a channel layer;
through-vias extending in the first direction and electrically connecting at least one of the gate electrodes or the channel structures to the circuit elements;
an insulating region surrounding side surfaces of the through-vias; and
a via pad that is located between the through-vias and at least one of the lower interconnection lines in the first direction and is spaced apart from the second substrate in a second direction that is parallel to the upper surface of the second substrate.

16. The semiconductor device of claim 15, wherein the via pad includes a pad line extending in a direction, parallel to the upper surface of the second substrate, and connected to at least a portion of the through-vias.

17. The semiconductor device of claim 16, wherein the pad line includes a plurality of pad lines that are located in a grid shape in a plan view.

18. The semiconductor device of claim 15, wherein a bent portion based on a change in width is between the via pad and at least one through-via of the through-vias.

19. A data storage system comprising:
a semiconductor storage device including
a first substrate,
circuit elements that are located on the first substrate,
lower interconnection lines electrically connected to the circuit elements,
a second substrate that is located on the lower interconnection lines,
gate electrodes spaced apart from each other and stacked in a first direction on the second substrate, wherein the first direction is perpendicular to an upper surface of the second substrate,
channel structures penetrating through the gate electrodes, extending in the first direction, and respectively including a channel layer,
through-vias extending in the first direction and electrically connecting at least one of the gate electrodes or the channel structures to the circuit elements,
an insulating region surrounding side surfaces of through-vias,
a via pad that is located between the through-vias and at least one of the lower interconnection lines in the first direction and is spaced apart from the second substrate in a second direction that is parallel to the upper surface of the second substrate, and
an input/output pad electrically connected to the circuit elements; and
processing circuitry that is electrically connected to the semiconductor storage device through the input/output pad, the processing circuitry configured to control the semiconductor storage device.

20. The data storage system of claim 19, wherein the via pad includes
- first pad lines that are extending in the second direction, and
- second pad lines intersecting the first pad lines and extending in a third direction.

* * * * *